United States Patent
Sato et al.

(10) Patent No.: US 12,329,036 B2
(45) Date of Patent: Jun. 10, 2025

(54) DIELECTRIC THIN FILM, DIELECTRIC THIN FILM ELEMENT, PIEZOELECTRIC ACTUATOR, PIEZOELECTRIC SENSOR, HEAD ASSEMBLY, HEAD STACK ASSEMBLY, HARD DISK DRIVE, PRINTER HEAD AND INKJET PRINTER DEVICE

(71) Applicants: TDK Corporation, Tokyo (JP); TOKYO INSTITUTE OF TECHNOLOGY, Tokyo (JP)

(72) Inventors: Yusuke Sato, Tokyo (JP); Mirai Ishida, Tokyo (JP); Wakiko Sato, Tokyo (JP); Hiroshi Funakubo, Tokyo (JP); Takao Shimizu, Tokyo (JP); Miyu Hasegawa, Tokyo (JP); Keisuke Ishihama, Tokyo (JP)

(73) Assignees: TDK Corporation, Tokyo (JP); TOKYO INSTITUTE OF TECHNOLOGY, Tokyo (JP)

(*) Notice: Subject to any disclaimer, the term of this patent is extended or adjusted under 35 U.S.C. 154(b) by 1026 days.

(21) Appl. No.: 17/274,897

(22) PCT Filed: Sep. 11, 2019

(86) PCT No.: PCT/JP2019/035761
§ 371 (c)(1),
(2) Date: Mar. 10, 2021

(87) PCT Pub. No.: WO2020/054779
PCT Pub. Date: Mar. 19, 2020

(65) Prior Publication Data
US 2022/0059753 A1 Feb. 24, 2022

(30) Foreign Application Priority Data
Sep. 12, 2018 (JP) .................. 2018-170608

(51) Int. Cl.
*H01L 41/187* (2006.01)
*B41J 2/14* (2006.01)
(Continued)

(52) U.S. Cl.
CPC ...... *H10N 30/8561* (2023.02); *B41J 2/14201* (2013.01); *C04B 35/475* (2013.01);
(Continued)

(58) Field of Classification Search
CPC .............. H10N 30/076; H10N 30/079; H10N 30/8561; H10N 30/10516; B41J 2/14201;
(Continued)

(56) References Cited

U.S. PATENT DOCUMENTS

2008/0302658 A1 12/2008 Sasaki et al.
2013/0320806 A1* 12/2013 Ueda .................. H10N 30/2041
310/332
(Continued)

FOREIGN PATENT DOCUMENTS

JP 2006-327863 A 12/2006
JP 2010-016011 A 1/2010
(Continued)

OTHER PUBLICATIONS

International Preliminary Report on Patentability mailed Mar. 25, 2021 for PCT/JP2019/035761.
(Continued)

*Primary Examiner* — Emily P Pham
*Assistant Examiner* — Monica Mata
(74) *Attorney, Agent, or Firm* — Faegre Drinker Biddle Reath LLP

(57) ABSTRACT

Provided is a dielectric thin film including a metal oxide. The metal oxide includes bismuth, sodium, barium, and titanium, at least a part of the metal oxide is a tetragonal crystal having a perovskite structure, and a (100) plane of at
(Continued)

least a part of the tetragonal crystal is oriented in a normal direction of a surface of the dielectric thin film.

20 Claims, 12 Drawing Sheets

(51) Int. Cl.
    *C04B 35/475*    (2006.01)
    *G01C 19/5607*   (2012.01)
    *G01L 1/16*      (2006.01)
    *G11B 5/127*     (2006.01)
    *H01L 41/08*     (2006.01)
    *H01L 41/316*    (2013.01)
    *H01L 41/319*    (2013.01)
    *H10N 30/00*     (2023.01)
    *H10N 30/076*    (2023.01)
    *H10N 30/079*    (2023.01)
    *H10N 30/853*    (2023.01)

(52) U.S. Cl.
    CPC ............ *G01C 19/5607* (2013.01); *G01L 1/16* (2013.01); *G11B 5/127* (2013.01); *H10N 30/076* (2023.02); *H10N 30/079* (2023.02); *H10N 30/708* (2024.05); *C04B 2235/3236* (2013.01); *C04B 2235/761* (2013.01); *C04B 2235/765* (2013.01); *C04B 2235/768* (2013.01)

(58) Field of Classification Search
    CPC ............ C04B 35/475; C04B 2235/761; C04B 2235/765; C04B 2235/768; C04B 2235/3236; G01C 19/5607; G01L 1/16; G11B 5/127
    USPC ........................................................ 310/358
    See application file for complete search history.

(56) References Cited

U.S. PATENT DOCUMENTS

2014/0113828 A1\*   4/2014   Gilbert ................ G01K 7/006
                                                          252/500
2015/0243878 A1     8/2015   Tanaka et al.

FOREIGN PATENT DOCUMENTS

JP         2015-179803 A     10/2015
WO    WO-2017/111090 A1    6/2017

OTHER PUBLICATIONS

Hasegawa, Miyu, et al., "Fabrication and evaluation of (Bi, Na)TiO$_3$—BaTiO$_3$ based thin film by using PLD method," The 65th JSAP Spring Meeting, 2018 [lecture preprints], The Japan Society of Applied Physics, Mar. 5, 2018.

\* cited by examiner (a)

(b)

DIELECTRIC THIN FILM, DIELECTRIC THIN FILM ELEMENT, PIEZOELECTRIC ACTUATOR, PIEZOELECTRIC SENSOR, HEAD ASSEMBLY, HEAD STACK ASSEMBLY, HARD DISK DRIVE, PRINTER HEAD AND INKJET PRINTER DEVICE

TECHNICAL FIELD

The present invention relates to a dielectric thin film, a dielectric thin film element, a piezoelectric actuator, a piezoelectric sensor, a head assembly, a head stack assembly, a hard disk drive, a printer head, and an inkjet printer device.

BACKGROUND ART

A piezoelectric material, which is a kind of a dielectric material, is processed into various piezoelectric elements in correspondence with various purposes. For example, a piezoelectric actuator converts a voltage into a force by an inverse piezoelectric effect of deforming the piezoelectric material by applying a voltage to the piezoelectric material. In addition, the piezoelectric sensor converts a force into a voltage by a piezoelectric effect of deforming the piezoelectric material by applying a pressure to the piezoelectric material. The piezoelectric element is mounted on various electronic devices.

In the related art, a lead zirconate titanate ($PbTiO_3$—$PbZrO_3$; PZT), which is a perovskite type ferroelectric material, has been frequently used as the piezoelectric material. However, since PZT includes lead harming the human body or an environment, research and development of lead-free piezoelectric material have been conducted as an alternative of PZT. As an example of the lead-free piezoelectric material, $[(Na, Bi)_{1-x}Ba_x]TiO_3$ having ferroelectricity is known. For example, a piezoelectric material described in Patent Literature 1 described below is composed of a $[(Na, Bi)_{1-x}Ba_x]TiO_3$ crystal having an orientation of only a (001) plane.

CITATION LIST

Patent Literature

Patent Literature 1: Japanese Unexamined Patent Publication No. 2015-179803

SUMMARY OF INVENTION

Technical Problem

As described in the above Patent Literature 1, in a case where only the (001) plane of $[(Na, Bi)_{1-x}Ba_x]TiO_3$ is oriented, a thin film consisting of the $[(Na, Bi)_{1-x}Ba_x]TiO_3$ crystal does not have sufficient dielectric property.

An object of the invention is to provide a dielectric thin film having an excellent dielectric property, a dielectric thin film element including the dielectric thin film, and a piezoelectric actuator, a piezoelectric sensor, a head assembly, a head stack assembly, a hard disk drive, a printer head, and an inkjet printer device which use the dielectric thin film element.

Solution to Problem

According to an aspect of the invention, there is provided a dielectric thin film including a metal oxide. The metal oxide includes bismuth, sodium, barium, and titanium, at least a part of the metal oxide is a tetragonal crystal having a perovskite structure, and a (100) plane of at least a part of the tetragonal crystal is oriented in a normal direction of a surface of the dielectric thin film.

The metal oxide may be expressed by the following Chemical Formula 1.

$$(1-x)(Bi_{0.5}Na_{0.5})TiO_3 \text{-} xBaTiO_3 \qquad (1)$$

[In the above Chemical Formula 1, x satisfies 0.15≤x≤0.40.]

When an electric field parallel to the normal direction of the surface of the dielectric thin film is applied to the dielectric thin film, a peak area of a diffracted X-ray of a (001) plane of the tetragonal crystal may not increase.

When an electric field parallel to the normal direction of the surface of the dielectric thin film is applied to the dielectric thin film, a peak area of a diffracted X-ray of a (001) plane of the tetragonal crystal may increase.

In a state in which an electric field parallel to the normal direction of the surface of the dielectric thin film is applied to the dielectric thin film, a (100) plane of a part of the tetragonal crystal may be oriented in the normal direction of the surface of the dielectric thin film, and a (001) plane of another part of the tetragonal crystal may be oriented in the normal direction of the surface of the dielectric thin film.

According to an aspect of the invention, there is provided a dielectric thin film element including the dielectric thin film.

The dielectric thin film element according to the aspect of the invention may include: a single crystal substrate; and the dielectric thin film stacked on the single crystal substrate. A (100) plane of at least a part of the tetragonal crystal may be oriented in a normal direction of a surface of the single crystal substrate.

The dielectric thin film element according to the aspect of the invention may include the single crystal substrate, a first electrode layer stacked on the single crystal substrate, the dielectric thin film stacked on the single crystal substrate through the first electrode layer, and a second electrode layer stacked on the dielectric thin film.

The dielectric thin film element according to the aspect of the invention may further include at least one intermediate layer. The intermediate layer may be disposed between the single crystal substrate and the first electrode layer, between the first electrode layer and the dielectric thin film, or between the dielectric thin film and the second electrode layer.

The dielectric thin film element according to the aspect of the invention may include the single crystal substrate, a first electrode layer stacked on the single crystal substrate, a first crystalline layer stacked on the first electrode layer, a second crystalline layer stacked on the first crystalline layer, the dielectric thin film stacked on the second crystalline layer and a second electrode layer stacked on the dielectric thin film. The first crystalline layer may include a $LaNiO_3$ crystal having a perovskite structure, the second crystalline layer may include a $SrRuO_3$ crystal having the perovskite structure, a (100) plane of the first crystalline layer may be oriented in a normal direction of a surface of the single crystal substrate, and a (100) plane of the second crystalline layer may be oriented in the normal direction of the surface of the single crystal substrate.

The dielectric thin film element according to the aspect of the invention may include the single crystal substrate, a first electrode layer stacked on the single crystal substrate, a first crystalline layer stacked on the first electrode layer, a second crystalline layer stacked on the first crystalline layer, the dielectric thin film stacked on the second crystalline layer, and a second electrode layer stacked on the dielectric thin film. The first crystalline layer may include a LaNiO$_3$ crystal having a perovskite structure, the second crystalline layer may include a (La, Sr)CoO$_3$ crystal having a perovskite structure, a (100) plane of the first crystalline layer may be oriented in a normal direction of a surface of the single crystal substrate, and a (100) plane of the second crystalline layer may be oriented in the normal direction of the surface of the single crystal substrate.

The dielectric thin film element according to the aspect of the invention may be a piezoelectric element.

According to an aspect of the invention, there is provided a piezoelectric actuator including the dielectric thin film element (piezoelectric element).

According to still an aspect of the invention, there is provided a piezoelectric sensor including the dielectric thin film element (piezoelectric element).

According to an aspect of the invention, there is provided a head assembly including the piezoelectric actuator.

According to an aspect of the invention, there is provided a head stack assembly including the head assembly.

According to an aspect of the invention, there is provided a hard disk drive including the head stack assembly.

According to an aspect of the invention, there is provided a printer head including the piezoelectric actuator.

According to an aspect of the invention, there is provided an inkjet printer device including the printer head.

Advantageous Effects of Invention

According to the invention, there are provided a dielectric thin film having an excellent dielectric property, a dielectric thin film element including the dielectric thin film, and a piezoelectric actuator, a piezoelectric sensor, a head assembly, a head stack assembly, a hard disk drive, a printer head, and an inkjet printer device which use the dielectric thin film element.

DESCRIPTION OF EMBODIMENTS

Figure 1:
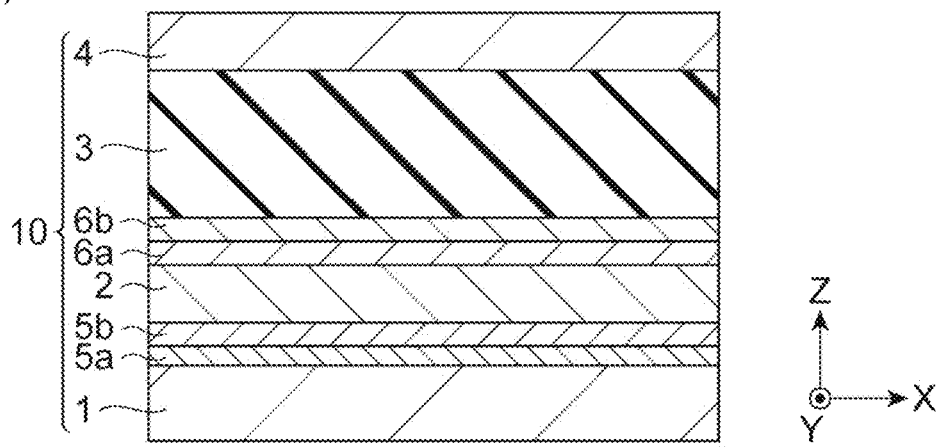
FIG. 1(a) is a schematic cross-sectional view of a dielectric thin film element according to an embodiment of the invention, and FIG. 1(b) includes an exploded perspective view of a piezoelectric thin film element shown in FIG. 1(a), and perspective views of unit cells (a first unit cell tc1 and a second unit cell tc2) of a perovskite structure.
(In FIG. 1(b), a first electrode layer and a second electrode layer are omitted.)
Figure 1:
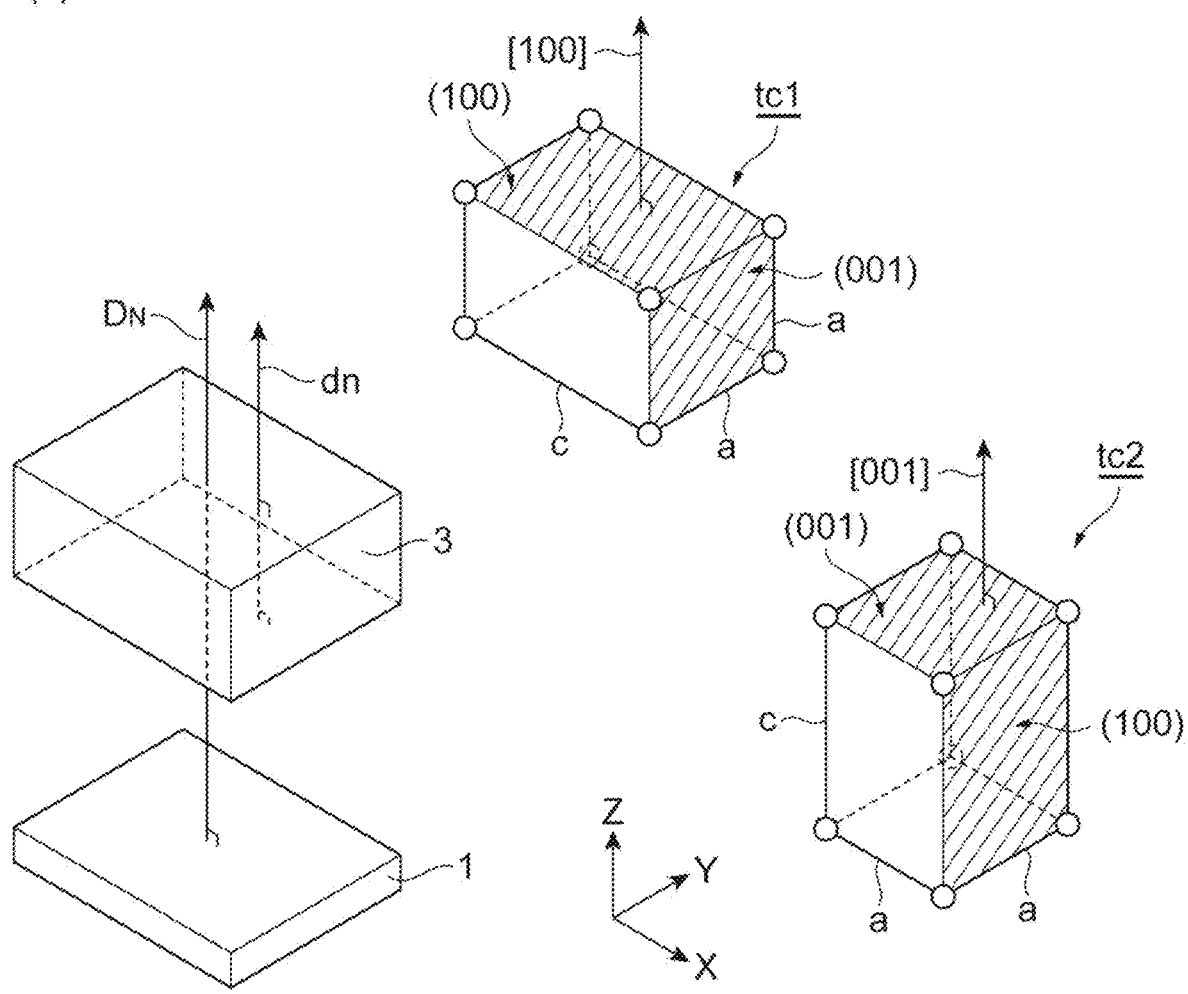

Hereinafter, a preferred embodiment of the invention will be described in detail with reference to the accompanying drawings. In the drawings, the same reference numeral will be given to the same or equivalent element. X, Y, and Z shown in FIG. 1(a) and FIG. 1(b) represent three coordinate axes orthogonal to each other. The invention is not limited to the following embodiment.

(Dielectric Thin Film and Dielectric Thin Film Element)

As shown in FIG. 1(a), a dielectric thin film element 10 according to this embodiment includes a single crystal substrate 1, a first electrode layer 2 (lower electrode layer) stacked on the single crystal substrate 1, a dielectric thin film 3 stacked indirectly on the single crystal substrate 1 through the first electrode layer 2, and a second electrode layer 4 (upper electrode layer) stacked on the dielectric thin film 3. That is, in the dielectric thin film element 10, the dielectric thin film 3 is interposed between a pair of electrode layers. A modification example of the dielectric thin film element 10 may not include the second electrode layer 4. For example, after a dielectric thin film element that is not provided with the second electrode layer is supplied to a manufacturer of an electronic device as a product, the second electrode layer may be added to the dielectric thin film element in a process of manufacturing and assembling the electronic device. For example, the dielectric thin film element 10 may be a thin film capacitor.

The dielectric thin film 3 includes a metal oxide. The metal oxide includes bismuth, sodium, barium, and titanium. The dielectric thin film 3 may include the metal oxide as a main component. The main component represents a component of which a ratio to all components constituting the dielectric thin film 3 is 99 to 100 mol %. A part or the entirety of the metal oxide is crystalline and has a perovskite structure. At least a part of the metal oxide is a tetragonal crystal having the perovskite structure at room temperature. The entirety of the metal oxide may be the tetragonal crystal having the perovskite structure at room temperature.

The metal oxide included in the dielectric thin film 3 may be expressed by the following Chemical Formula 1. Hereinafter, an oxide expressed by the following Chemical Formula 1 is noted as "BNT-BT" in some cases.

$$(1-x)(Bi_{0.5}Na_{0.5})TiO_3\text{-}xBaTiO_3 \tag{1}$$

In the above Chemical Formula 1, x may satisfy 0<x<1, 0.15≤x≤0.70, 0.15≤x≤0.600, 0.15≤x<0.50, or 0.15≤x≤0.40.

The above Chemical Formula 1 may be equivalent to the following Chemical Formula 1a.

$$(Bi_{0.5}Na_{0.5})_{1-x}Ba_xTiO_3 \tag{1a}$$

In the above Chemical Formula 1a, x may satisfy 0<x<1, 0.15≤x≤0.70, 0.15≤x≤0.600, 0.15≤x<0.50, or 0.15≤x≤0.40.

In a case where the dielectric thin film 3 includes an oxide expressed by the above Chemical Formula 1, a dielectric property and piezoelectric characteristics of the dielectric thin film 3 are likely to be improved. In a case where x is within a range of 0.15≤x≤0.70, the dielectric property and the piezoelectric characteristics of the dielectric thin film 3 are more likely to be improved. Particularly, in a case where x is within a range of 0.15≤x≤0.40, a (100) plane of the tetragonal crystal of the metal oxide is likely to be oriented in a normal direction of a surface of the dielectric thin film 3, and the dielectric property and the piezoelectric characteristics of the dielectric thin film 3 are more likely to be improved. The dielectric thin film 3 may consist of only the oxide expressed by the above Chemical Formula 1. The dielectric thin film 3 may consist of only a single crystal of the oxide expressed by the above Chemical Formula 1. The dielectric thin film 3 may consist of only a polycrystal of the oxide expressed by the above Chemical Formula 1. The dielectric thin film 3 may include components other than the oxide expressed by the above Chemical Formula 1 as long as the perovskite structure of the tetragonal crystal of the oxide expressed by the above Chemical Formula 1 is not damaged. That is, the dielectric thin film 3 may include other elements in addition to Bi, Na, Ba, Ti, and O. However, it is preferable that the dielectric thin film 3 does not include lead harming the human body or an environment.

A first unit cell tc1 shown in FIG. 1(b) is a unit cell constituting the tetragonal crystal of the metal oxide. The first unit cell tc1 is a rectangular parallelepiped. A kind of element selected from the group consisting of Bi, Na, and Ba is located at each of eight vertexes of the first unit cell tc1. For convenience of explanation, in FIG. 1(b), a body center Ti of the first unit cell tc1 is omitted, and six face centers O of the first unit cell tc1 are also omitted. A plane interval of the (100) plane of the perovskite structure constituted by the first unit cell tc1 is expressed by a. a may be referred to as a lattice constant in an a-axis direction of the first unit cell tc1. A plane interval of a (001) plane of the perovskite structure constituted by the first unit cell tc1 is expressed by c. c may be referred to as a lattice constant in a c-axis direction of the first unit cell tc1. c/a represents the degree of distortion (anisotropy) of the perovskite structure. c/a of a tetragonal crystal having the perovskite structure is greater than 1. As c/a is greater, the dielectric thin film 3 tends to have an excellent dielectric property. In addition, as c/a is greater, the dielectric thin film 3 tends to have an excellent piezoelectric property, and thus a piezoelectric constant $d_{33}$ of the dielectric thin film 3 is likely to increase.

As shown by the first unit cell tc1, a (100) plane of at least a part of the tetragonal crystal is oriented in a normal direction dn of the surface of the dielectric thin film 3. In other words, [100](crystal orientation) of at least a part of the tetragonal crystal may be approximately parallel to the normal direction dn of the surface of the dielectric thin film 3. The (100) plane of the entirety of the tetragonal crystal may be oriented in the normal direction dn of the surface of the dielectric thin film 3. The surface of the dielectric thin film 3 is a surface excluding end face of the dielectric thin film 3 among the entire surface of the dielectric thin film 3. For example, the surface of the dielectric thin film 3 is a surface parallel to an XY plane in FIG. 1(b) among the entire surface of the dielectric thin film 3. The surface of the dielectric thin film 3 may be a surface facing a surface of the single crystal substrate 1. The normal direction dn of the surface of the dielectric thin film 3 may be referred to as a thickness direction (Z-axis direction) of the dielectric thin film 3. [100] of the first unit cell tc1 may be referred to as a spontaneous polarization direction of the dielectric thin film 3.

When the (100) plane of at least a part of the tetragonal crystal is oriented in the normal direction dn of the surface of the dielectric thin film 3, the dielectric thin film 3 can have an excellent dielectric property. In other words, when [100] of at least a part of the tetragonal crystal is approximately parallel to the normal direction dn of the surface of the dielectric thin film 3, the dielectric thin film 3 can have high relative permittivity. A dielectric loss (tan δ) of the dielectric thin film 3 according to this embodiment tends to be smaller than a dielectric loss of a dielectric thin film including BNT-BT in the related art. A resistivity of the dielectric thin film 3 according to this embodiment tends to be higher than a resistivity of the dielectric thin film including BNT-BT in the related art.

The (100) plane of at least a part of the tetragonal crystal may be oriented in the normal direction $D_N$ of the surface of the single crystal substrate 1. In other words, [100](crystal orientation) of at least a part of the tetragonal crystal may be approximately parallel to the normal direction $D_N$ of the surface of the single crystal substrate 1. The (100) plane of the entirety of the tetragonal crystal may be oriented in the normal direction $D_N$ of the surface of the single crystal substrate 1. The surface of the single crystal substrate 1 is a surface excluding end face of the single crystal substrate 1 among the entire surface of the single crystal substrate 1. For example, the surface of the single crystal substrate 1 is a surface parallel to the XY-plane in FIG. 1(b) among the entire surface of the single crystal substrate 1. The surface of the single crystal substrate 1 may be a surface facing the surface of the dielectric thin film 3. The normal direction $D_N$ of the surface of the single crystal substrate 1 may be referred to as a thickness direction (Z-axis direction) of the single crystal substrate 1.

Hereinafter, a peak area of a diffracted X-ray caused by the (100) plane oriented in the normal direction dn of the surface of the dielectric thin film 3 is noted as "$A_{(100)}$". On the other hand, a peak area of a diffracted X-ray derived from the (001) plane oriented in the normal direction dn of the surface of the dielectric thin film 3 is noted as "$A_{(001)}$".

When an electric field parallel to the normal direction dn of the surface of the dielectric thin film 3 is applied to the dielectric thin film 3, $A_{(001)}$ may increase. In other words, in a state in which the electric field parallel to the normal direction dn of the surface of the dielectric thin film 3 is applied to the dielectric thin film 3, the (100) plane of a part of the tetragonal crystal may be oriented in the normal direction dn of the surface of the dielectric thin film 3, and the (001) plane of another part of the tetragonal crystal may be oriented in the normal direction dn of the surface of the dielectric thin film 3. $A_{(100)}$ may decrease and $A_{(001)}$ may increase in accordance with an increase in strength of the electric field applied to the dielectric thin film 3. $A_{(100)}$ may increase and $A_{(001)}$ may decrease in accordance with a decrease in strength of the electric field applied to the dielectric thin film 3. When a voltage is applied to the dielectric thin film 3, electric field strength between a front surface and a rear surface of the dielectric thin film 3 may be, for example, 5 to 50 kV/mm.

A tetragonal crystal of which the (100) plane is oriented in the normal direction dn of the surface of the dielectric thin film 3 is constituted by the first unit cell tc1 shown in FIG. 1(b). Hereinafter, the tetragonal crystal constituted by the first unit cell tc1 is noted as "a-domain". That is, the a-domain is a tetragonal crystal of which the (100) plane is oriented in the normal direction dn of the surface of the dielectric thin film 3. On the other hand, a tetragonal crystal of which the (001) plane is oriented in the normal direction dn of the surface of the dielectric thin film 3 is constituted by a second unit cell tc2 shown in FIG. 1(b). A crystal orientation of the second unit cell tc2 is different from a crystal orientation constituted by the first unit cell tc1. [001](crystal orientation) of the second unit cell tc2 is approximately parallel to [100] of the first unit cell tc1. The second unit cell tc2 may be the same as the first unit cell tc1 except for the difference in the crystal orientation. Hereinafter, a tetragonal crystal constituted by the second unit cell tc2 is noted as "c-domain". The c-domain is a tetragonal crystal of which the (001) plane is oriented in the normal direction dn of the surface of the dielectric thin film 3. [001](crystal orientation) of the c-domain is approximately parallel to [100] of the a-domain.

The increase in the peak area $A_{(001)}$ in accordance with application of the electric field represents that at least a part of a-domains is changed to the c-domain. That is, in a state in which the electric field is applied to the dielectric thin film 3, the dielectric thin film 3 may include both the a-domain and the c-domain which are different in the crystal orientation. Hereinafter, a change from the a-domain to the c-domain in accordance with application of the electric field is noted as "domain switching effect". Hereinafter, a structure of the dielectric thin film 3 including both the a-domain and the c-domain is noted as a "multi-domain structure". The dielectric thin film 3 capable of having the multi-domain structure in an electric field is noted as "multi-domain film". After the dielectric thin film 3 becomes the multi-domain film due to application of the electric field, the multi-domain film may return to the dielectric thin film 3 due to disappearance of the electric field. That is, the dielectric thin film 3 may be reversibly changed to the multi-domain film.

When the electric field parallel to the normal direction dn of the surface of the dielectric thin film 3 is applied to the dielectric thin film 3, the peak area of the diffracted X-ray of the (001) plane of the tetragonal crystal may not increase. That is, the dielectric thin film 3 may not the multi-domain thin film. The dielectric thin film 3 that is not the multi-domain thin film is noted as "non-multi-domain film".

The multi-domain film may be more excellent in a piezoelectric property in comparison to the non-multi-domain film in some cases. In other words, the piezoelectric constant $d_{33}$ of the multi-domain film may be greater than the piezoelectric constant $d_{33}$ of the non-multi-domain film in some cases. $-e_{31,f}$ (another piezoelectric constant) of the multi-domain film may be greater than $-e_{31,f}$ of the non-multi-domain film in some cases. In addition, the dielectric loss (tan δ) of the multi-domain film tends to be smaller than a dielectric loss of the non-multi-domain film. On the other hand, a relative permittivity of the non-multi-domain film is higher than a relative permittivity of the multi-domain film. The non-multi-domain film may not have a piezoelectric property.

When the electric field parallel to the normal direction dn of the surface of the dielectric thin film 3 is applied to the dielectric thin film 3, Vc defined by the following Mathematical Formula A may be 10% to 70%. Vc may be regarded as a ratio of a volume of the c-domain to the sum of the volumes of the a-domain and c-domain. When Vc is within the above-described range, the piezoelectric constant $d_{33}$ of the multi-domain film is likely to increase, and the dielectric loss of the multi-domain film is likely to decrease.

$$Vc=100\times A_{(001)}/(A_{(100)}+A_{(001)}) \quad (A)$$

A composition of a part of the dielectric thin film 3 may deviate from the composition of BNT-BT expressed by the above Chemical Formula 1. In a case where a composition of an oxide having the perovskite structure is expressed by $ABO_3$, in a part of the dielectric thin film 3, a part of Ti occupying a B site may be substituted with any one of element among Bi, Na, and Ba. In a part of the dielectric thin film 3, an oxygen defect may occur. For example, a composition of a part of the dielectric thin film 3 may expressed by the following Chemical Formula 2 as long as the perovskite structure is not damaged.

$$(Bi_{0.5\pm\delta1}Na_{0.5\pm\delta2})_{1-x}Ba_xTiO_{3\pm\delta3} \quad (2)$$

In the above Chemical Formula 2, x may satisfy 0<x<1, 0.15≤x≤0.70, 0.15≤x≤0.600, 0.15≤x<0.50, or 0.15≤x≤0.40. δ1 may satisfy 0.5±δ1≥0. δ2 may satisfy 0.5±δ2≥0. δ3 may satisfy 3±δ3≥0. Each of δ1, δ2, and δ3 is greater than 0 and equal to or less than 1.0. For example, δ1, δ2, and δ3 may be calculated from an electron state of each of an A-site ion and a B-site ion which is measured by synchrotron X-ray diffraction.

For example, a thickness of the dielectric thin film 3 may be approximately 10 nm to 10 μm. For example, an area of the dielectric thin film 3 may be 1 μm² to 500 mm². An area of each of the single crystal substrate 1, the first electrode layer 2, and the second electrode layer 4 may be the same as the area of the dielectric thin film 3.

For example, the single crystal substrate 1 may be a substrate consisting of a single crystal of Si, or a substrate consisting of a single crystal of a compound semiconductor such as GaAs. The single crystal substrate 1 may be a substrate consisting of a single crystal of an oxide such as MgO. The single crystal substrate 1 may be a substrate consisting of a single crystal of a perovskite-type oxide such as $KTaO_3$. For example, a thickness of the single crystal substrate 1 may be 10 to 1000 μm. In a case where the single crystal substrate 1 has conductivity, the single crystal substrate 1 functions as an electrode, and thus the first electrode layer 2 may not be provided. That is, in a case where the single crystal substrate 1 has conductivity, the dielectric thin film 3 may be stacked directly on the single crystal substrate 1.

A crystal orientation of the single crystal substrate 1 may be the same as the normal direction $D_N$ of the surface of the single crystal substrate 1. That is, the surface of the single crystal substrate 1 may be a crystal plane of the single crystal substrate 1. The single crystal substrate 1 may be a uniaxially oriented substrate. For example, at least one crystal plane of the single crystal substrate 1, which is selected from the group consisting of a (100) plane, a (001) plane, a (110) plane, a (101) plane, and a (111) plane, may be the surface of the single crystal substrate 1. That is, at least one crystal orientation of the single crystal substrate 1, which is selected from the group consisting of [100], [001], [110], [101], and [111], may be parallel to the normal direction $D_N$ of the surface of the single crystal substrate 1.

For example, the first electrode layer 2 may consist of at least one kind of metal selected from the group consisting of platinum (Pt), palladium (Pd), rhodium (Rh), gold (Au), ruthenium (Ru), iridium (Ir), molybdenum (Mo), titanium (Ti), tantalum (Ta), and nickel (Ni). For example, the first electrode layer 2 may consist of at least one kind of conductive metal oxide selected from the group consisting of $LaNiO_3$, $SrRuO_3$, and $(La, Sr)CoO_3$. As a result, the (100) plane of the tetragonal crystal included in the dielectric thin film 3 is likely to be oriented in the normal direction dn of the surface of the dielectric thin film 3. The first electrode layer 2 may be crystalline. A crystal orientation of a surface of the first electrode layer 2 may be approximately parallel to [100] of the tetragonal crystal included in the dielectric thin film 3. As a result, the (100) plane of the tetragonal crystal included in the dielectric thin film 3 is likely to be oriented in the normal direction dn of the surface of the dielectric thin film 3. [100](crystal orientation) of the first electrode layer 2 may be approximately parallel to [100] of the tetragonal crystal included in the dielectric thin film 3. As a result, the (100) plane of the tetragonal crystal included in the dielectric thin film 3 is likely to be oriented in the normal direction dn of the surface of the dielectric thin film 3. The crystal orientation of the surface of the first electrode layer 2 may be oriented in the normal direction $D_N$ of the single crystal substrate 1. Both the crystal orientation of the surface of the single crystal substrate 1 and a plane direction of a crystal structure of the first electrode layer 2 may be oriented in the normal direction $D_N$ of the surface of the single crystal substrate 1. The crystal orientation of the first electrode layer 2 oriented in the normal direction $D_N$ may be the same as the crystal orientation of the single crystal substrate 1 oriented in the normal direction $D_N$. For example, a thickness of the first electrode layer 2 may be 1 nm to 1.0 μm. A method for forming the first electrode layer 2 may be a sputtering method, a vacuum vapor deposition method, a printing method, a spin coating method, or a sol-gel method. In the printing method, the spin coating method, or the sol-gel method, heating of the first electrode layer 2 may be performed to raise crystallinity of the first electrode layer 2.

The dielectric thin film 3 may be formed, for example, by following methods.

A BNT-BT target is used for the formation of the dielectric thin film 3. The BNT-BT target may be a target consisting of an oxide expressed by the above Chemical Formula 1. In a vapor phase growth method to be described later, bismuth and sodium in the BNT-BT target are more volatile in comparison to other elements. Accordingly, a molar ratio of bismuth in the BNT-BT target may be set to a value higher than a molar ratio of bismuth in the dielectric thin film 3, and a molar ratio of sodium in the BNT-BT target may be set to a value higher than a molar ratio of sodium in the dielectric thin film 3. A method for producing the BNT-BT target is as follows.

As starting raw materials, for example, raw material powders of bismuth oxide, sodium carbonate, titanium oxide, and barium carbonate are prepared. After the starting raw materials are sufficiently dried at a temperature of 100° C. or hither, the respective starting raw materials are weighed so that the number of moles of Bi, the number of moles of Na, the number of moles of Ti, and the number of moles of Ba are within a range defined by the above Chemical Formula 1 in composition analysis after film formation. As the starting raw materials instead of the above oxides, materials becoming oxides through sintering, such as a carbonate or oxalate, may be used.

For example, the weighed starting raw materials are sufficiently mixed in an organic solvent or water for 5 to 20 hours by using a ball mill or the like. The mixed starting raw materials are sufficiently dried, and are molded by a press machine. The molded starting raw materials are calcined at 750 to 900° C. for approximately 1 to 3 hours. Next, the calcined material is pulverized in an organic solvent or water for 5 to 30 hours by using a ball mill or the like. The pulverized calcined material is dried again, and is granulated by adding a binder solution to the calcined material, thereby obtaining a powder of the calcined material. The powder is press molded to obtain a block-shaped molded body.

The block-shaped molded boy is heated at 400 to 800° C. for approximately 2 to 4 hours to volatilize the binder. Next, the molded body is sintered at 800 to 1100° C. for 2 to 4 hours. A temperature rising rate and a temperature lowering rate of the molded body in main sintering may be adjusted to, for example, approximately 50 to 300° C./hour.

Through the above-described process, the BNT-BT target is obtained. For example, an average grain size of BNT-BT crystal grains included in the BNT-BT target may be approximately 1 to 20 μm.

The dielectric thin film 3 may be formed by the vapor phase growth method using the BNT-BT target. In the vapor phase growth method, elements constituting the BNT-BT target are caused to evaporate under a vacuum atmosphere. The evaporated elements are caused to adhere and to be deposited to a surface of any one of the butter layer (intermediate layer), the first electrode layer 2, and the single crystal substrate 1, thereby growing the dielectric thin film 3. The vapor phase growth method may be, for example, a sputtering method, an electron beam vapor deposition method, chemical vapor deposition method, or a pulsed-laser deposition method. Hereinafter, the pulsed-laser deposition method is noted as a PLD method. When using these vapor phase growth methods, a dense film can be formed in an atomic level, and segregation or the like is less likely to occur. An excitation source is different depending on a type of the vapor phase growth method. An excitation source of the sputtering method is Ar plasma. An excitation source of the electron beam vapor deposition method is an electron beam. An excitation source of the PLD method is laser light (for example, an excimer laser). When the BNT-BT target is irradiated with the excitation source, elements constituting the BNT-BT target evaporate.

Among the vapor phase growth methods, the PLD method is relatively excellent from the following viewpoint. In the PLD method, the respective elements constituting the BNT-BT target can be uniformly turned into plasma by a pulse laser. Accordingly, it is easy to form the dielectric thin film 3 having approximately the same composition as in the BNT-BT target. In addition, in the PLD method, it is easy to control a thickness of the dielectric thin film 3 by changing the number of laser pulses (repetition frequency).

The dielectric thin film 3 may be formed by epitaxial growth. The dielectric thin film 3 excellent in orientation of the (100) plane is likely to be formed by the epitaxial growth. In a case where the dielectric thin film 3 is formed by the PLD method, the dielectric thin film 3 is likely to be formed by the epitaxial growth.

In the PLD method, the dielectric thin film 3 is formed while heating the single crystal substrate 1 and the first electrode layer 2 in a vacuum chamber. A temperature (film formation temperature) of the single crystal substrate 1 and the first electrode layer 2 may be, for example, 300 to 800° C., 500 to 700° C., or 500 to 600° C. As the film formation temperature is higher, cleanliness of a surface on which the dielectric thin film 3 is formed is improved, and crystallinity of the dielectric thin film 3 becomes high. As a result, the degree of orientation of the (100) plane of the tetragonal crystal included in the dielectric thin film 3 is likely to increase. In a case where the film formation temperature is excessively high, Bi or Na is likely to be released from the dielectric thin film 3, and it is difficult to control the composition of the dielectric thin film 3.

In the PLD method, an oxygen partial pressure in the vacuum chamber may be, for example, greater than 10 mTorr and less than 400 mTorr, 15 to 300 mTorr, or 20 to 200 mTorr. In other words, the oxygen partial pressure in the vacuum chamber may be, for example, greater than 1 Pa and less than 53 Pa, 2 to 40 Pa, or 3 to 30 Pa. When the oxygen partial pressure is maintained within the range, Bi, Na, and Ti which are deposited to a surface of any one of the buffer layer, the first electrode layer 2, and the single crystal substrate 1 is likely to be sufficiently oxidized. In a case where the oxygen partial pressure is excessively high, a growth rate and the degree of orientation of the dielectric thin film 3 are likely to decrease.

Parameters controlled in the PLD method except for the above parameters include, for example, a laser oscillation frequency, a distance between a substrate and a target, and the like. It is easy to obtain desired piezoelectric characteristics of the dielectric thin film 3 through control of the parameters. For example, in a case where the laser oscillation frequency is 10 Hz or less, the degree of orientation in the surface direction of the dielectric thin film 3 is likely to increase.

After the dielectric thin film 3 is grown by the above method, an annealing treatment (heating treatment) on the dielectric thin film 3 may be performed. A temperature (annealing temperature) of the dielectric thin film 3 in the annealing treatment may be, for example, 300 to 1000° C., 600 to 1000° C., or 850 to 1000° C. When performing the annealing treatment after the dielectric thin film 3 is grown, the dielectric property and the piezoelectric property of the dielectric thin film 3 tend to be further improved. Particularly, when performing the annealing treatment at 850 to 1000° C., the piezoelectric property and the piezoelectric property of the dielectric thin film 3 are likely to be improved. However, the annealing treatment is not essential.

For example, for example, the second electrode layer 4 may consist of at least one kind of metal selected from the group consisting of Pt, Pd, Rh, Au, Ru, Ir, Mo, Ti, Ta, and Ni. For example, the second electrode layer 4 may consist of at least one kind of conductive metal oxide selected from the group consisting of $LaNiO_3$, $SrRuO_3$, and $(La, Sr)CoO_3$. The second electrode layer 4 may be crystalline. A crystal orientation of a surface of the second electrode layer 4 may be approximately parallel to the crystal orientation of the surface of the single crystal substrate 1. The crystal orientation of the surface of the second electrode layer 4 may be approximately parallel to [100] of the tetragonal crystal included in the dielectric thin film 3. For example, a thickness of the second electrode layer 4 may be 1 nm to 1.0 μm. A method for forming the second electrode layer 4 may be a sputtering method, a vacuum deposition method, a printing method, a spin coating method, or a sol-gel method. In the printing method, the spin coating method, or the sol-gel method, the first electrode layer 2 may be heated so as to increase crystallinity of the first electrode layer 2.

The dielectric thin film element 10 may further include at least one intermediate layer. The intermediate layer may be referred to as a buffer layer. As to be described below, the intermediate layer may be disposed between the single crystal substrate 1 and the first electrode layer 2, between the first electrode layer 2 and the dielectric thin film 3, or the dielectric thin film 3 and the second electrode layer 4.

An intermediate layer (substrate-side intermediate layer) may be interposed between the single crystal substrate 1 and the first electrode layer 2. That is, the substrate-side intermediate layer may be stacked directly on the surface of the single crystal substrate 1. For example, a material constituting the substrate-side intermediate layer may be at least one kind selected from the group consisting of Ti, Cr, $TiO_2$, $SiO_2$, $Y_2O_3$, and $ZrO_2$. In a case where the single crystal substrate 1 is a Si single crystal, the first electrode layer 2 is likely to adhere to the single crystal substrate 1 through the substrate-side intermediate layer. The substrate-side intermediate layer may be crystalline. A crystal orientation of a surface of the substrate-side intermediate layer may be oriented in the normal direction $D_N$ of the surface of the single crystal substrate 1. Both the crystal orientation of the surface of the single crystal substrate 1 and the crystal orientation of the surface of the substrate-side intermediate layer may be oriented in the normal direction $D_N$ of the surface of the single crystal substrate 1. The crystal orientation of the substrate-side intermediate layer oriented in the normal direction $D_N$ may be the same as the crystal orientation of the single crystal substrate 1 oriented in the normal direction $D_N$.

As shown in FIG. 1(a), the substrate-side intermediate layer may be constituted by a first adhesion layer 5a stacked on the single crystal substrate 1, and a second adhesion layer 5b stacked on the first adhesion layer 5a. For example, the first adhesion layer 5a may consist of a $SiO_2$ crystal. For example, the second adhesion layer 5b may consist of a $TiO_2$ crystal.

A first intermediate layer (buffer layer) may be interposed between the first electrode layer 2 and the dielectric thin film 3. For example, a material constituting the first intermediate layer may be at least one kind selected from the group consisting of $LaNiO_3$, $SrRuO_3$, and $(La, Sr)CoO_3$. The first intermediate layer may be crystalline. A crystal orientation of a surface of the first intermediate layer may be oriented in the normal direction $D_N$ of the surface of the single crystal substrate 1. Both the crystal orientation of the surface of the single crystal substrate 1 and the crystal orientation of the surface of the first intermediate layer may be oriented in the normal direction $D_N$ of the surface of the single crystal substrate 1. The crystal orientation of the first intermediate layer oriented in the normal direction $D_N$ may be the same as the crystal orientation of the single crystal substrate 1 oriented in the normal direction $D_N$.

The first intermediate layer may be constituted by two or more layers as described below.

For example, as shown in FIG. 1(a), the first intermediate layer may be constituted by a first crystalline layer 6a and a second crystalline layer 6b. That is, the dielectric thin film element 10 may include the single crystal substrate 1, the first electrode layer 2 stacked on the single crystal substrate 1, the first crystalline layer 6a stacked on the first electrode layer 2, the second crystalline layer 6b stacked on the first crystalline layer 6a, the dielectric thin film 3 stacked on the second crystalline layer 6b, and the second electrode layer 4 stacked on the dielectric thin film 3.

The first crystalline layer 6a may include a $LaNiO_3$ crystal having the perovskite structure, the second crystalline layer 6b may include a $SrRuO_3$ crystal having the perovskite structure, a (100) plane of the first crystalline layer 6a may be oriented in the normal direction $D_N$ of the surface of the single crystal substrate 1, and a (100) plane of the second crystalline layer 6b may be oriented in the normal direction of the surface of the single crystal substrate 1. As a result, the dielectric thin film 3 stacked on the second crystalline layer 6b is likely to be a non-multi-domain film.

The first crystalline layer 6a may include a $LaNiO_3$ crystal having the perovskite structure, the second crystalline layer 6b may include $(La, Sr)CoO_3$ crystal having the perovskite structure, a (100) plane of the first crystalline layer 6a may be oriented in the normal direction $D_N$ of the surface of the single crystal substrate 1, and a (100) plane of the second crystalline layer 6b may be oriented in the normal direction of the surface of the single crystal substrate 1. As a result, the dielectric thin film 3 stacked on the second crystalline layer 6b is likely to be a multi-domain film.

A second intermediate layer may be interposed between the dielectric thin film 3 and the second electrode layer 4. A material constituting the second intermediate layer may be the same as the material constituting the first intermediate layer. The second intermediate layer may be crystalline. A crystal orientation of the surface of the second intermediate layer may be oriented in the normal direction $D_N$ of the surface of the single crystal substrate 1. Both the crystal orientation of the surface of the single crystal substrate 1 and the crystal orientation of the surface of the second intermediate layer may be oriented in the normal direction $D_N$ of the surface of the single crystal substrate 1. The crystal orientation of the second intermediate layer oriented in the normal direction $D_N$ may be the same as the crystal orientation of the single crystal substrate 1 oriented in the normal direction DN.

At least a part or the entirety of the surface of the dielectric thin film element 10 may be covered with a protective film. Due to covering with the protective film, for example, moisture resistance of the dielectric thin film element 10 is improved.

The dielectric thin film 3 according to this embodiment may be a piezoelectric thin film, and the dielectric thin film element 10 according to this embodiment may be a piezoelectric element. Particularly, a multi-domain film is suitable for the piezoelectric thin film, and thus the dielectric thin film element including the multi-domain film is suitable for a piezoelectric element. Application of the piezoelectric element is various. For example, the piezoelectric element may be used in a piezoelectric actuator. For example, the piezoelectric actuator may be used in a head assembly, a head stack assembly, or a hard disk drive. For example, the piezoelectric actuator may be used in a printer head, or an inkjet printer device. For example, the piezoelectric element may be used in a piezoelectric sensor. For example, the piezoelectric element may be used in a piezoelectric sensor. For example, the piezoelectric sensor may be a Gyro sensor, a pressure sensor, a pulse wave sensor, or a shock sensor. For example, the piezoelectric thin film or the piezoelectric element may be applied to a microphone. The dielectric thin film or the dielectric thin film element may be applied to a part of micro electro mechanical systems (MEMS).

Hereinafter, the application of a dielectric thin and a dielectric thin film element will be described in detail. A piezoelectric thin film to be described below represents the dielectric thin film. A piezoelectric element to be described below represents a dielectric thin film element.

(Piezoelectric Actuator)

Figure 2:
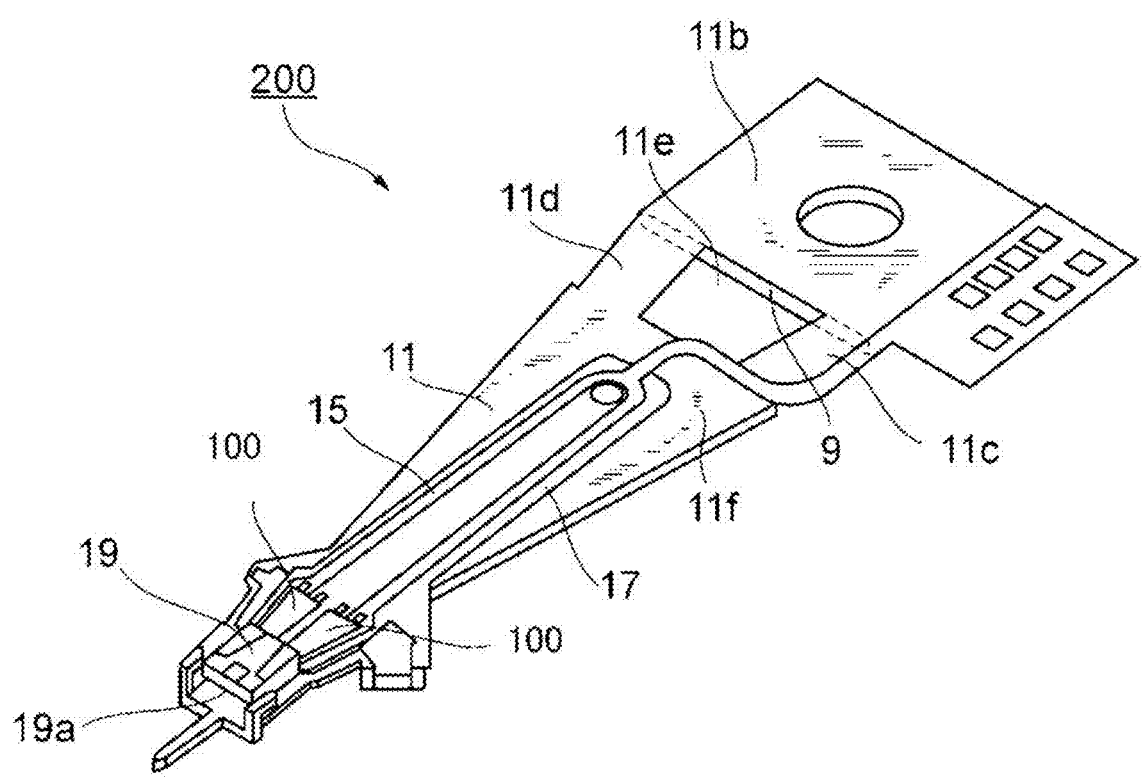
FIG. 2 is a schematic view of a head assembly according to an embodiment of the invention.

FIG. 2 shows a head assembly 200 mounted on a hard disk drive (HDD). A head assembly 200 includes a base plate 9, a load beam 11, a flexure 17, first and second piezoelectric elements 100, and a head slider 19. The first and second piezoelectric elements 100 are drive elements for the head slider 19. The head slider 19 includes a head element 19*a*.

The load beam 11 includes a base end portion 11*b* fixed to the base plate 9, a first leaf spring portion 11*c* and a second leaf spring portion 11*d* which extend from the base end portion 11*b*, an opening portion 11*e* formed between the leaf spring portions 11*c* and 11*d*, and a beam main portion 11*f* that linearly extends continuously from the leaf spring portions 11*c* and 11*d*. The first leaf spring portion 11*c* and the second leaf spring portion 11*d* are tapered. The beam main portion 11*f* is also tapered.

The first and second piezoelectric elements 100 are disposed on a flexible substrate 15 for wiring, which is a part of the flexure 17, with a predetermined interval. The head slider 19 is fixed to a tip end portion of the flexure 17, and rotates in accordance with expansion and contraction of the first and second piezoelectric elements 100.

Figure 3:
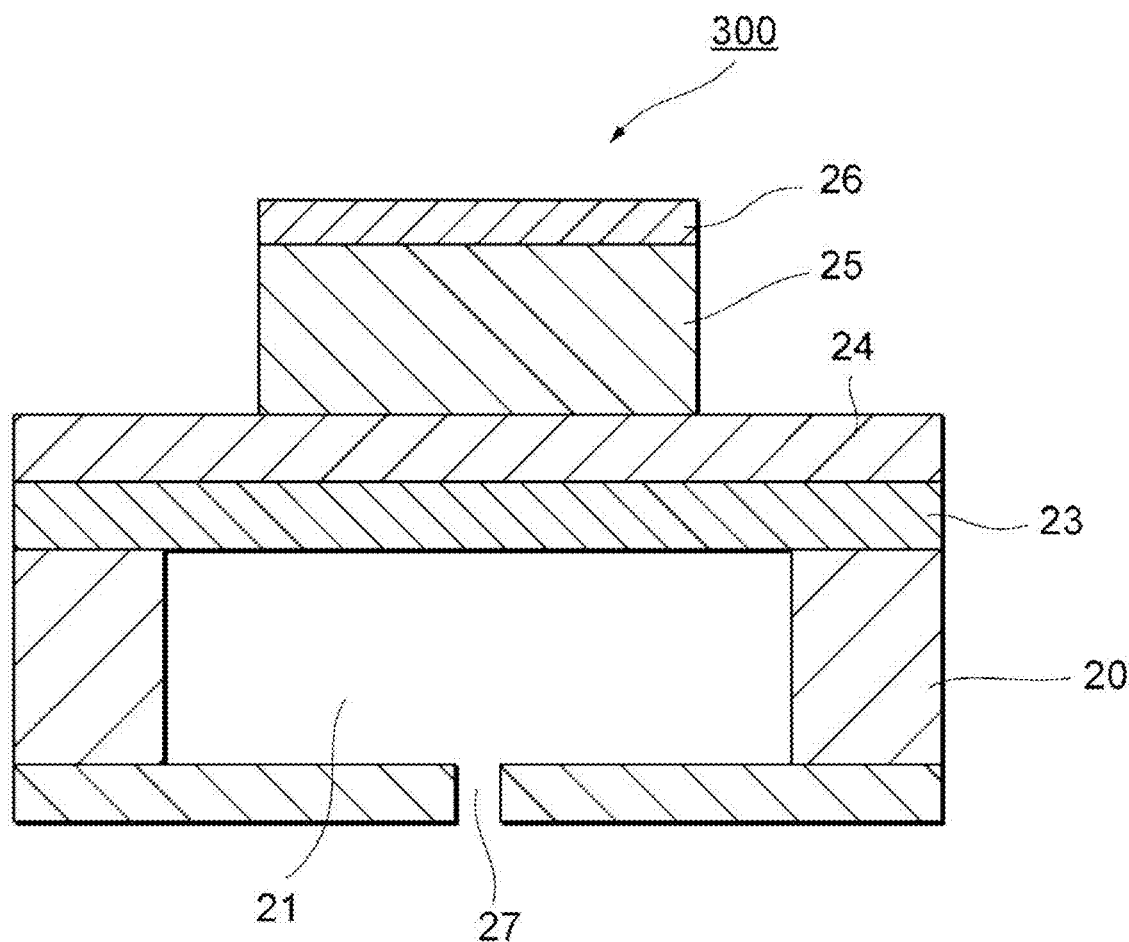
FIG. 3 is a schematic view of a piezoelectric actuator according to an embodiment of the invention.

FIG. 3 shows a piezoelectric actuator 300 for a printer head. The piezoelectric actuator 300 includes a base body 20, an insulating film 23 stacked on the base body 20, a single crystal substrate 24 stacked on the insulating film 23, a piezoelectric thin film 25 stacked on the single crystal substrate 24, and an upper electrode layer 26 (second electrode layer) stacked on the piezoelectric thin film 25. The single crystal substrate 24 has conductivity and also functions as a lower electrode layer. The lower electrode layer may be referred to as the first electrode layer. The upper electrode layer may be referred to as the second electrode layer.

In a case where a predetermined ejection signal is not supplied, and an electric field is not applied between the single crystal substrate 24 (lower electrode layer) and the upper electrode layer 26, the piezoelectric thin film 25 is not deformed. In a pressure chamber 21 adjacent to the piezoelectric thin film 25 to which the ejection signal is not supplied, a pressure variation does not occur, and an ink droplet is not ejected from a nozzle 27.

On the other hand, in a case where a predetermined ejection signal is supplied, and a constant electric field is applied between the single crystal substrate 24 (lower electrode layer) and the upper electrode layer 26, the piezoelectric thin film 25 is deformed. The insulating film 23 is greatly bent due to the deformation of the piezoelectric thin film 25, and thus a pressure inside the pressure chamber 21 is instantly raised, and an ink droplet is ejected from the nozzle 27.

(Piezoelectric Sensor)

Figure 4:
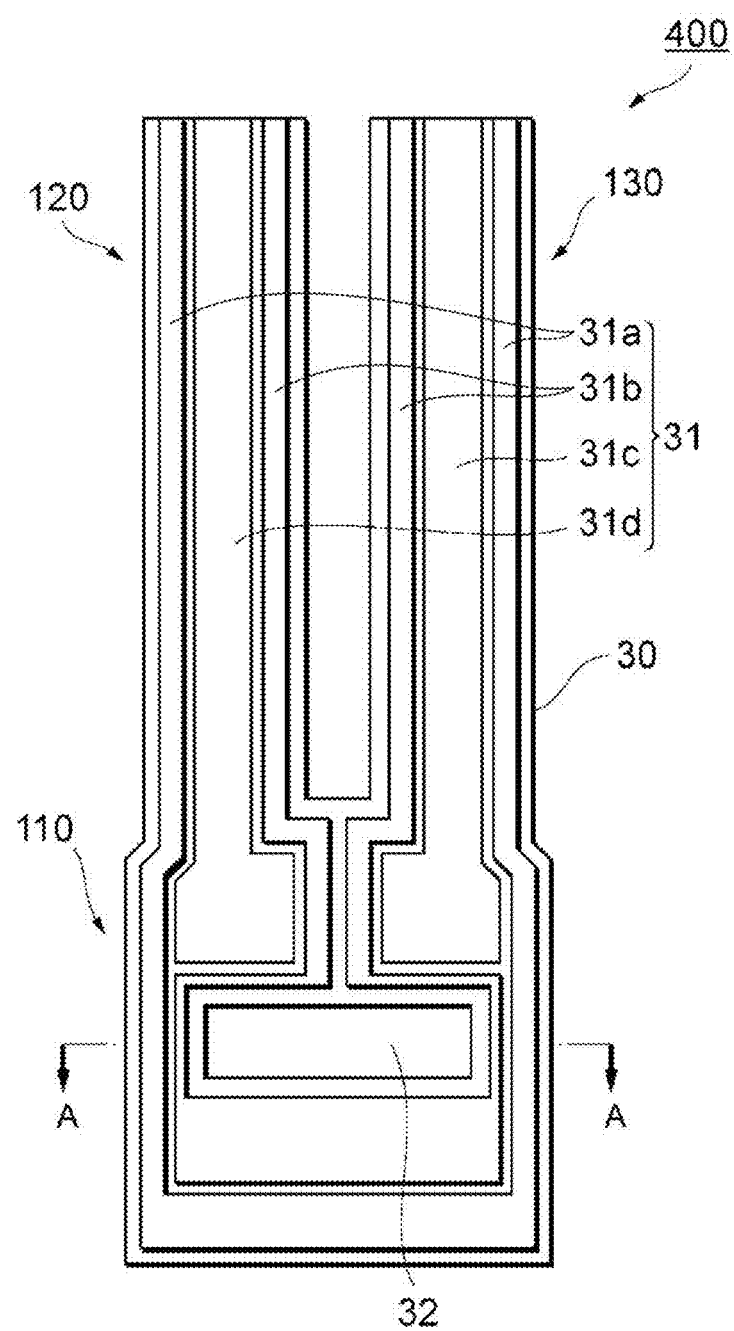
FIG. 4 is a schematic view (plan view) of a Gyro sensor according to an embodiment of the invention.
Figure 5:
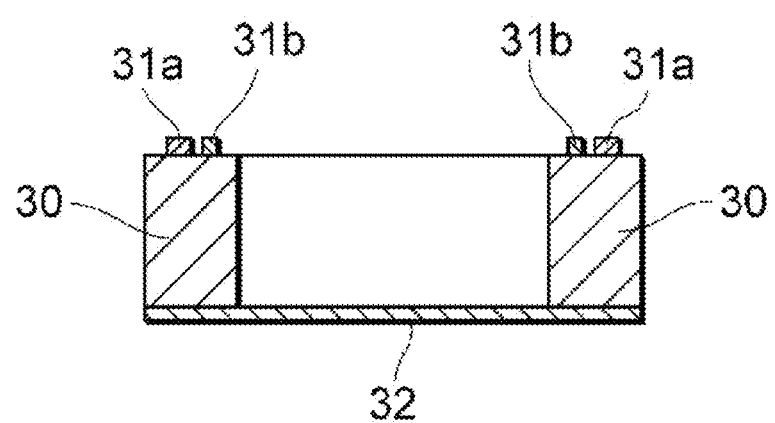
FIG. 5 is an arrow cross-sectional view along line A-A of the Gyro sensor shown in FIG. 4.

FIG. 4 and FIG. 5 show a Gyro sensor 400 that is a kind of piezoelectric sensor. The Gyro sensor 400 includes a base portion 110, and a pair of arms 120 and 130 which are connected to one surface of the base portion 110. The pair of arms 120 and 130 is a tuning-fork vibrator. That is, the Gyro sensor 400 is a tuning-fork type angular velocity detection element. The Gyro sensor 400 is obtained by processing a piezoelectric thin film 30 constituting the piezoelectric element, an upper electrode layer 31, and a single crystal substrate 32 into a shape of the tuning-fork type vibrator. The base portion 110 and the arms 120 and 130 are integrated with the piezoelectric element. The single crystal substrate 32 has conductivity, and also functions as a lower electrode layer.

Drive electrode layers 31*a* and 31*b*, and a detection electrode layer 31*d* are formed in a first main surface of the one arm 120. Similarly, the drive electrode layers 31*a* and 31*b*, and a detection electrode layer 31*c* are formed in a first main surface of the other arm 130. The respective electrode layers 31*a*, 31*b*, 31*c*, and 31*d* are obtained by processing the upper electrode layer 31 into a predetermined electrode shape through etching.

The single crystal substrate 32 (lower electrode layer) is formed over the entirety of the base portion 110, and second main surfaces (rear surfaces of the first main surfaces) of the arms 120 and 130. The single crystal substrate 32 (lower electrode layer) functions as a ground electrode of the Gyro sensor 400.

A longitudinal direction of each of the arms 120 and 130 is defined as a Z-direction, and a plane including the main surfaces of the arms 120 and 130 is defined as an XZ-plane, thereby defining an XYZ orthogonal coordinate system.

When a drive signal is supplied to the drive electrode layers 31*a* and 31*b*, the two arms 120 and 130 are excited in an in-plane vibration mode. The in-plane vibration mode is a mode in which the two arms 120 and 130 are excited in a direction parallel to the main surfaces of the two arms 120 and 130. For example, when the one arm 120 is excited in a −X direction at a velocity V1, the other arm 130 is excited in a +X direction at a velocity V2.

In this state, rotation at an angular velocity ω with a Z-axis set as a rotation axis is applied to the Gyro sensor 400, a Coriolis force acts on each of the arms 120 and 130 in a direction orthogonal to a velocity direction. As a result, the arms 120 and 130 start to be excited in an out-of-plane vibration mode. The out-of-plane vibration mode is a mode in which the two arms 120 and 130 are excited in a direction orthogonal to the main surfaces of the two arms 120 and 130. For example, when a Coriolis force F1 acting on the one arm 120 is in a −Y direction, a Coriolis force F2 acting on the other arm 130 is in a +Y direction.

Since the magnitudes of the Coriolis forces F1 and F2 are proportional to the angular velocity ω, mechanical deformations of the arms 120 and 130 due to the Coriolis forces F1 and F2 are converted into an electric signal (detection signal) by the piezoelectric thin film 30, and the electric signal is taken out from the detection electrode layers 31c and 31d to obtain the angular velocity ω.

Figure 6:
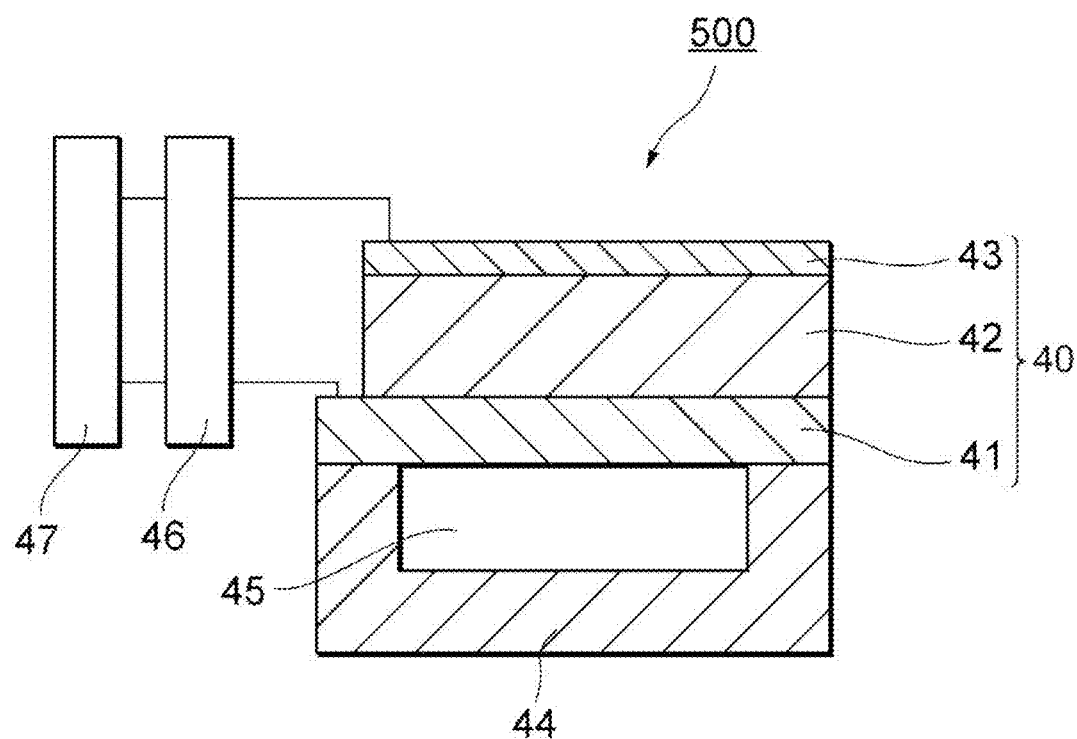
FIG. 6 is a schematic view of a pressure sensor according to an embodiment of the invention.

FIG. 6 shows a pressure sensor 500 that is a kind of the piezoelectric sensor. The pressure sensor 500 is constituted by a piezoelectric element 40, a support body 44 supporting the piezoelectric element 40, a current amplifier 46, and a voltage measurement device 47. The piezoelectric element 40 consists of a common electrode layer 41, a piezoelectric thin film 42 stacked on the common electrode layer 41, and an individual electrode layer 43 stacked on the piezoelectric thin film 42. The common electrode layer 41 is a conductive single crystal substrate. A cavity 45 surrounded by the common electrode layer 41 and the support body 44 corresponds to a pressure. When an external force is applied to the pressure sensor 500, the piezoelectric element 40 is bent, and a voltage is detected by the voltage measurement device 47.

Figure 7:
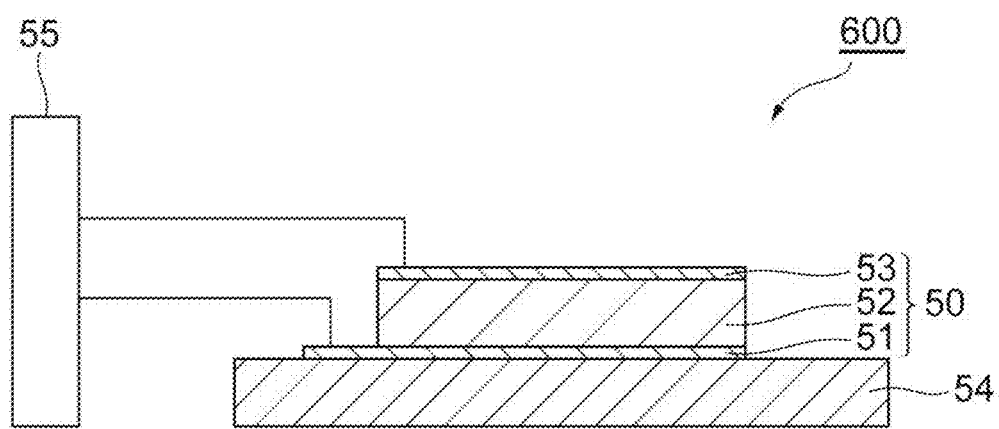
FIG. 7 is a schematic view of a pulse wave sensor according to an embodiment of the invention.

FIG. 7 shows a pulse wave sensor 600 that is a kind of the piezoelectric sensor. The pulse wave sensor 600 is constituted by a piezoelectric element 50, a support body 54 supporting the piezoelectric element 50, and a voltage measurement device 55. The piezoelectric element 50 consists of a common electrode layer 51, a piezoelectric thin film 52 stacked on the common electrode layer 51, and an individual electrode layer 53 stacked on the piezoelectric thin film 52. The common electrode layer 51 is a conductive single crystal substrate. When a rear surface (surface on which the piezoelectric element 50 is not mounted) of the support body 54 of the pulse wave sensor 600 is brought into contact with an artery of a living body, the support body 54 and the piezoelectric element 50 are bent due to a pressure caused by a pulse of the living body, and a voltage is detected by the voltage measurement device 55.

(Hard Disk Drive)

Figure 8:
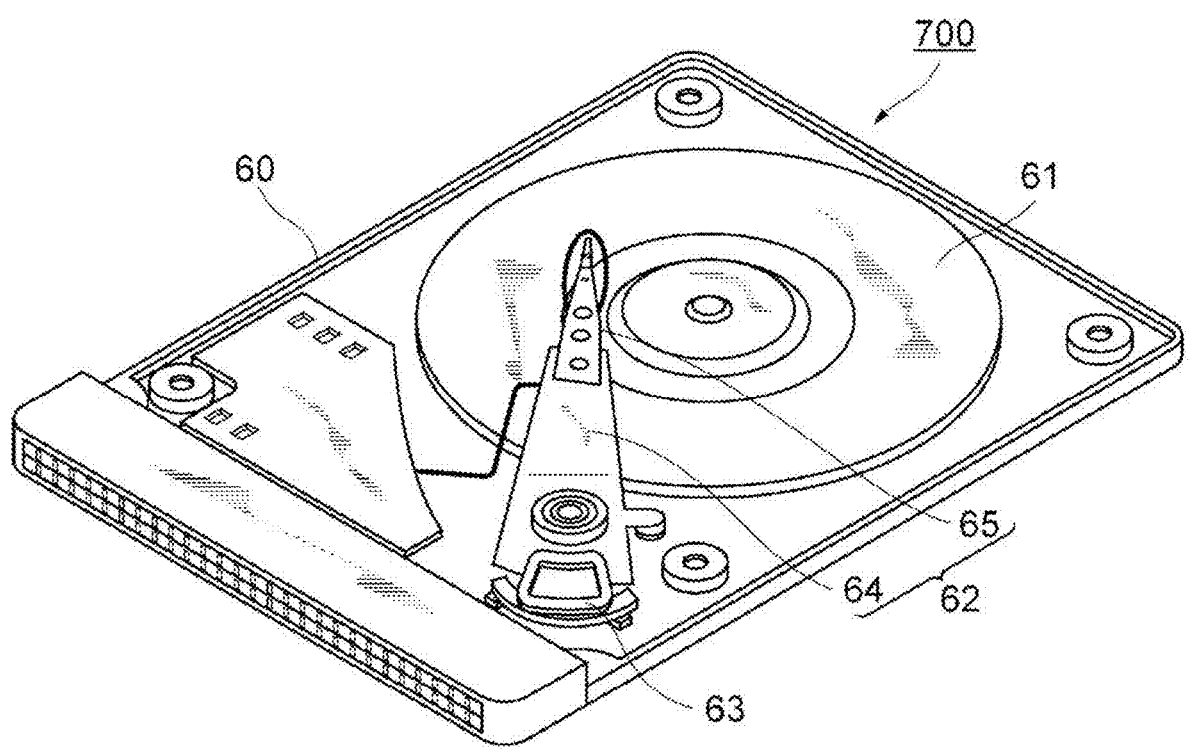
FIG. 8 is a schematic view of a hard disk drive according to an embodiment of the invention.

FIG. 8 shows a hard disk drive 700 on which a head assembly shown in FIG. 2 is mounted. A head assembly 65 in FIG. 8 is the same as the head assembly 200 in FIG. 2.

The hard disk drive 700 includes a casing 60, a hard disk 61 (recording medium) provided inside the casing 60, and a head stack assembly 62. The hard disk 61 is rotated by a motor. The head stack assembly 62 records magnetic information on the hard disk 61, or reproduces the magnetic information recorded on the hard disk 61.

The head stack assembly 62 includes a voice coil motor 63, an actuator arm 64 supported by a support shaft, and a head assembly 65 connected to the actuator arm 64. The actuator arm 64 is rotatable around the support shaft by the voice coil motor 63. The actuator arm 64 is divided into a plurality of arms, and the head assembly 65 is connected to each of the arms. That is, the plurality of arms and the head assembly 65 are stacked along the support shaft. A head slider 19 is attached to a tip end portion of the head assembly 65 to face the hard disk 61.

The head assembly 65 (200) causes the head element 19a to fluctuate in two steps. Relatively large movement of the head element 19a is controlled by driving the entirety of the head assembly 65 and the actuator arm 64 by the voice coil motor 63. Minute movement of the head element 19a is controlled by driving the head slider 19 located at the tip end portion of the head assembly 65.

(Inkjet Printer Device)

Figure 9:
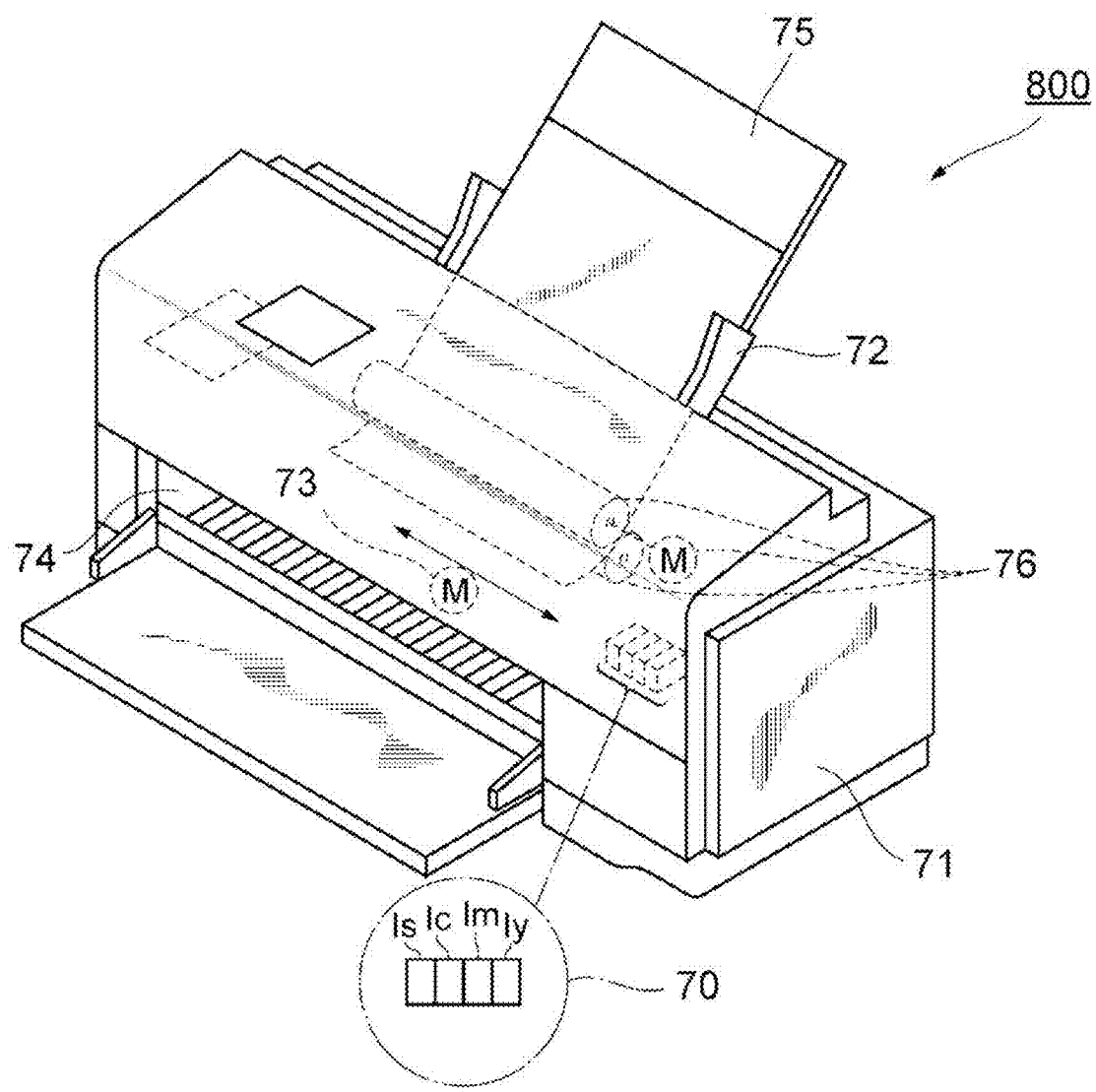
FIG. 9 is a schematic view of an inkjet printer device according to an embodiment of the invention.

FIG. 9 shows an inkjet printer device 800. The inkjet printer device 800 includes a printer head 70, a main body 71, a tray 72, and a head drive mechanism 73. The printer head 70 in FIG. 9 includes the piezoelectric actuator 300 in FIG. 3.

The inkjet printer device 800 includes ink cartridges of a total of four colors including yellow, magenta, cyan, and black. Full color printing by the inkjet printer device 800 is possible. A dedicated controller board and the like are mounted inside the inkjet printer device 800. The controller board and the like controls timing of ink ejection by the printer head 70, and scanning of the head drive mechanism 73. The tray 72 is provided on a rear surface of the main body 71, and an auto sheet feeder (automatic continuous paper feeding mechanism) 76 is provided in one end of the tray 72. The auto sheet feeder 76 automatically feeds recording paper 75, and ejects the recording paper 75 from a front ejection port 74.

Hereinbefore, the preferred embodiment of the invention has been described, but the invention is not limited to the embodiment. Various modifications can be made within a range not departing from the gist of the invention, and these modifications are included in the invention.

For example, the dielectric thin film 3 can be formed by a solution method instead of the vapor phase growth method.

EXAMPLES

Hereinafter, the invention will be described in more detail with reference to examples, but the invention is not limited to the examples.

Example 1

A single crystal substrate consisting of Si was prepared. A surface of the single crystal substrate was a (100) plane of Si. The single crystal substrate was a square of 10 mm×10 mm. A thickness of the single crystal substrate was 500 μm.

A first adhesion layer consisting of a $SiO_2$ crystal was formed on the entire surface of the single crystal substrate in a vacuum chamber.

A second adhesion layer consisting of a $TiO_2$ crystal was formed on the entire surface of the first adhesion layer in the vacuum chamber. The second adhesion layer was formed by a sputtering method.

A first electrode layer consisting of a Pt crystal was formed on the entire surface of the second adhesion layer in the vacuum chamber. The first electrode layer was formed by the sputtering method. A surface of the first electrode layer was a (111) plane of Pt.

A first buffer layer (first crystalline layer) consisting of a $LaNiO_3$ crystal was formed on the entire surface of the first electrode layer in the vacuum chamber. The first buffer layer was formed by the sputtering method. As a sputtering target, $LaNiO_3$ was used. A temperature of the single crystal substrate in a process of forming the first buffer layer was maintained at 350° C. A flow quantity ratio between an oxygen gas and an argon gas which were supplied into the vacuum chamber was oxygen:argon=3:1, and an atmospheric pressure (total pressure) inside the vacuum chamber was set to 10 mTorr. A surface of the first buffer layer was a (100) plane of $LaNiO_3$. A thickness of the first buffer layer was 70 nm.

A stacked body prepared by the above method was annealed in the vacuum chamber. A flow quantity ratio between an oxygen gas and a nitrogen gas which were supplied into the vacuum chamber was oxygen:nitrogen=1:4. In the annealing, the stacked body was heated up to 800° C. at a temperature rising rate of 50° C./minute, the stacked body was maintained at 800° C. for 30 minutes, and the stacked body was naturally cooled.

A second buffer layer (second crystalline layer) consisting of a $La_{0.5}Sr_{0.5}CoO_3$ crystal was formed on the entire surface of the first buffer layer in the vacuum chamber. The second buffer layer was formed by epitaxial growth using a PLD method. As a PLD target, $La_{0.5}Sr_{0.5}CoO_3$ was used. A temperature of the single crystal substrate in a process of forming the second buffer layer was maintained at 675° C. A gas supplied into the vacuum chamber was an oxygen gas, and an atmospheric pressure (total pressure) inside the vacuum chamber was set to 200 mTorr. A surface of the second buffer layer was a (100) plane of $La_{0.5}Sr_{0.5}CoO_3$. A thickness of the second buffer layer was 90 nm.

A dielectric thin film was formed on the entire surface of the second buffer layer in the vacuum chamber. The dielectric thin film was formed by epitaxial growth using the PLD method. A temperature of the single crystal substrate in a process of forming the dielectric thin film (film formation temperature) was maintained at 675° C. An oxygen partial pressure inside the vacuum chamber in a process of forming the dielectric thin film was maintained at 200 mTorr. A BNT-BT target was used for the formation of the dielectric thin film. When preparing the BNT-BT target, a mixing ratio of raw material powders (bismuth oxide, sodium carbonate, titanium oxide, and barium carbonate) of the BNT-BT target was determined in correspondence with a desired composition of the dielectric thin film, and the composition of the BNT-BT target was a composition expressed by the following Chemical Formula 3. A value of x in the following Chemical Formula 3 was 0.3. A power of a laser irradiated to the BNT-BT target was 250 mJ. A frequency of the laser was 5 Hz. A thickness of the dielectric thin film was adjusted to 2000 nm.

$(1-x)(Bi_{0.7}Na_{0.7})TiO_3\text{-}xBaTiO_3$ (3)

A stacked body including the single crystal substrate, the first electrode layer stacked on the single crystal substrate, and the dielectric thin film stacked on the single crystal substrate through the first electrode layer was prepared by the above-described method. A composition of the dielectric thin film located on a surface of the stacked body was analyzed by a fluorescent X-ray analysis method (XRF method). In the analysis, a device PW2404 manufactured by Koninklijke Philips N. V. was used. As a result of the analysis, it was confirmed that the composition of the dielectric thin film of Example 1 was expressed by the following Chemical Formula 1, and the value of x in the following Chemical Formula 1 was 0.3.

$(1-x)(Bi_{0.5}Na_{0.5})TiO_3\text{-}xBaTiO_3$ (1)

A second electrode layer that consisted of Pt and had a dot shape (circular shape) was formed on a surface of the dielectric thin film provided in the stacked body in the vacuum chamber. A radius of the second electrode layer was 200 µm. The second electrode layer was formed by the sputtering method. A temperature of the single crystal substrate in a process of forming the second electrode layer was maintained at 500° C. A thickness of the second electrode layer was adjusted to 0.1 µm.

A dielectric thin film element of Example 1 was prepared by the above method. The dielectric thin film element included the single crystal substrate, the first adhesion layer stacked on the single crystal substrate, the second adhesion layer stacked on the first adhesion layer, the first electrode layer stacked on the second adhesion layer, the first buffer layer stacked on the first electrode layer, the second buffer layer stacked on the first buffer layer, the dielectric thin film stacked on the second buffer layer, and the second electrode layer stacked on the dielectric thin film.

<Analysis of Dielectric Thin Film Element>
[Specifying of Crystal Structure]

An X-ray diffraction (XRD) pattern of the dielectric thin film formed by the above method was measured. An X-ray diffraction device (XLPert MVRD) manufactured by Koninklijke Philips N. V. was used for the measurement. Measurement of 2θ-θ was performed in a range where a diffraction angle 2θ was 10 to 70°. Measurement conditions were set so that an intensity of each peak in the XRD pattern becomes higher than background intensity by at least three digits or greater. The XRD pattern of Example 1 showed that the BNT-BT constituting the dielectric thin film was a crystal having a perovskite structure.

A lattice constant a of the BNT-BT in a direction perpendicular to the surface of the dielectric thin film was obtained by out-of-plane measurement. The lattice constant a corresponds to a plane interval a of a crystal plane parallel to the surface of the dielectric thin film. A lattice constant c of the BNT-BT in a direction parallel to the surface of the dielectric thin film was obtained by in-plane measurement. The lattice constant c corresponds to a plane interval c of a crystal plane perpendicular to the surface of the dielectric thin film. A plane direction of each of a (100) plane and a (001) plane of the crystal of the BNT-BT was specified through comparison between the lattice constant a and the lattice constant c. Since the BNT-BT is a tetragonal crystal having a perovskite structure at room temperature, a plane interval of the (100) of BNT-BT is smaller than a plane interval of the (001) plane of BNT-BT. In the case of Example 1, a plane interval a of a crystal plane parallel to the surface of the dielectric thin film was smaller than a plane interval c of a crystal plane perpendicular to the surface of the dielectric thin film. Accordingly, the BNT-BT crystal was a tetragonal crystal having a perovskite structure, the crystal plane parallel to the surface of the dielectric thin film was the (100) plane of the tetragonal crystal, and the crystal plane of the tetragonal crystal perpendicular to the surface of the single crystal substrate was the (001) plane. That is, the (100) plane of the tetragonal crystal having the perovskite structure was oriented in the normal direction of the surface of the dielectric thin film. The plane interval a of the (100) plane of the tetragonal crystal was 3.94 Å, and the plane interval c of the (001) plane of the tetragonal crystal was 3.98 Å. c/a was 1.01.

[Characteristic of Multi-Domain Structure]
Experiments 1 to 3 were conducted as follows.

Experiment 1

Figure 10:
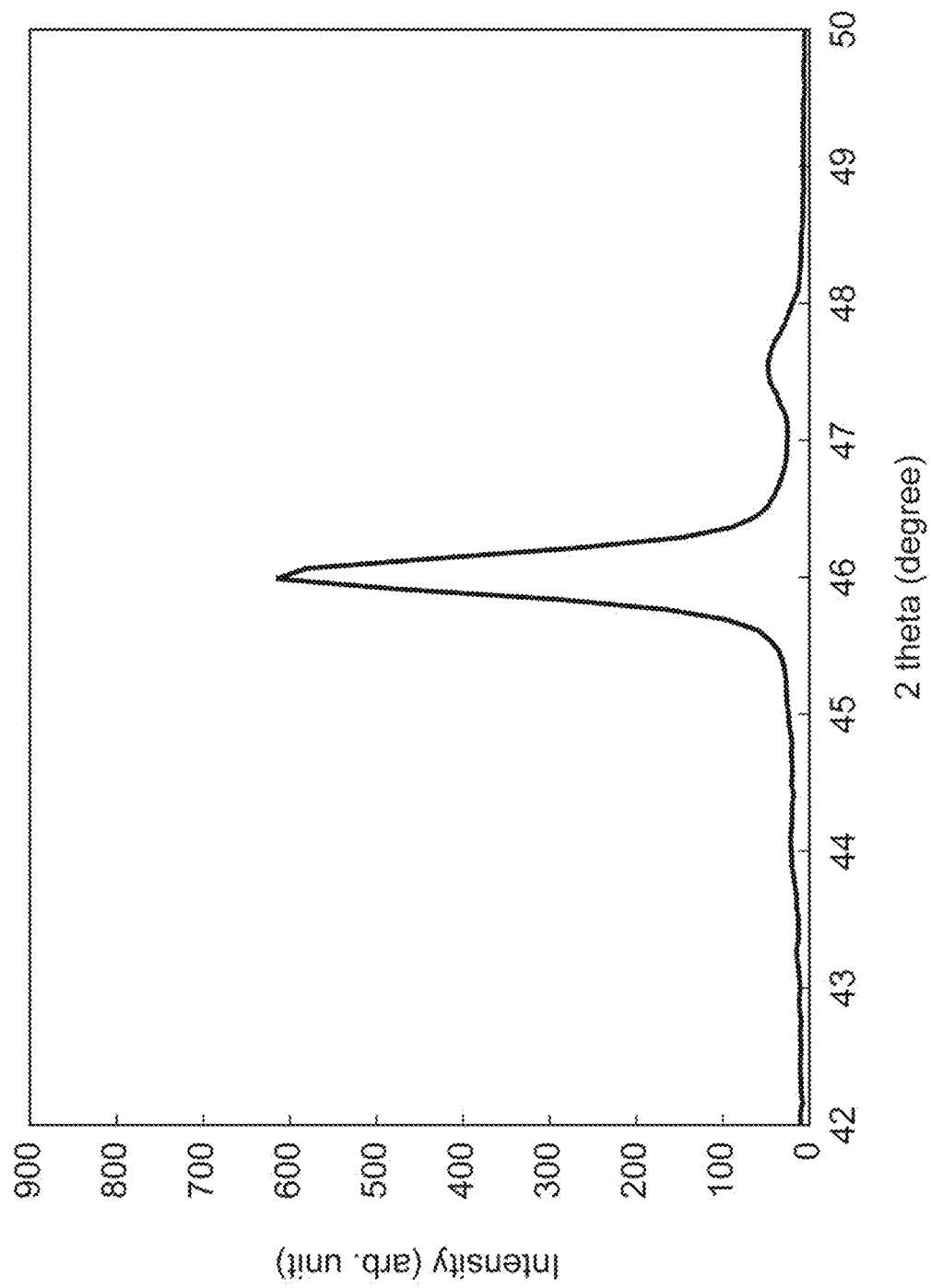
FIG. 10 is an X-ray diffraction pattern of Example 1 of the invention which is measured by Experiment 1.

In the case of Experiment 1, an X-ray diffraction (XRD) pattern of the dielectric thin film element was measured in a state in which a voltage was not applied between the first electrode layer and the second electrode layer. An X-ray diffraction device (D8) manufactured by Bruker Corporation was used for the measurement. Measurement of 2θ-θ was performed in a range where a diffraction angle 2θ was 10 to 70°. Measurement conditions were set so that an intensity of each peak in the XRD pattern becomes higher than background intensity by at least three digits or greater. The XRD pattern measured by Experiment 1 is shown in FIG. 10.

The XRD pattern had a diffracted X-ray peak with a diffraction angle 2θ of 46.0°. The diffracted X-ray with the diffraction angle 2θ of 46.0° is derived from the (100) plane of the tetragonal crystal oriented in the normal direction of the surface of the dielectric thin film. That is, the (100) plane of the tetragonal crystal constituting the dielectric thin film was oriented in the normal direction of the surface of the dielectric thin film. On the other hand, the XRD pattern did not have a diffracted X-ray peak with a diffraction angle 2θ of 45.6°. The diffracted X-ray with the diffraction angle 2θ of 45.6° should be derived from the (001) plane of the tetragonal crystal oriented in the normal direction of the surface of the dielectric thin film. Accordingly, the dielectric thin film did not include the tetragonal crystal of which the (001) plane is oriented in the normal direction of the surface of the dielectric thin film.

Experiment 2

After Experiment 1, the following Experiment 2 was conducted.

Figure 11:
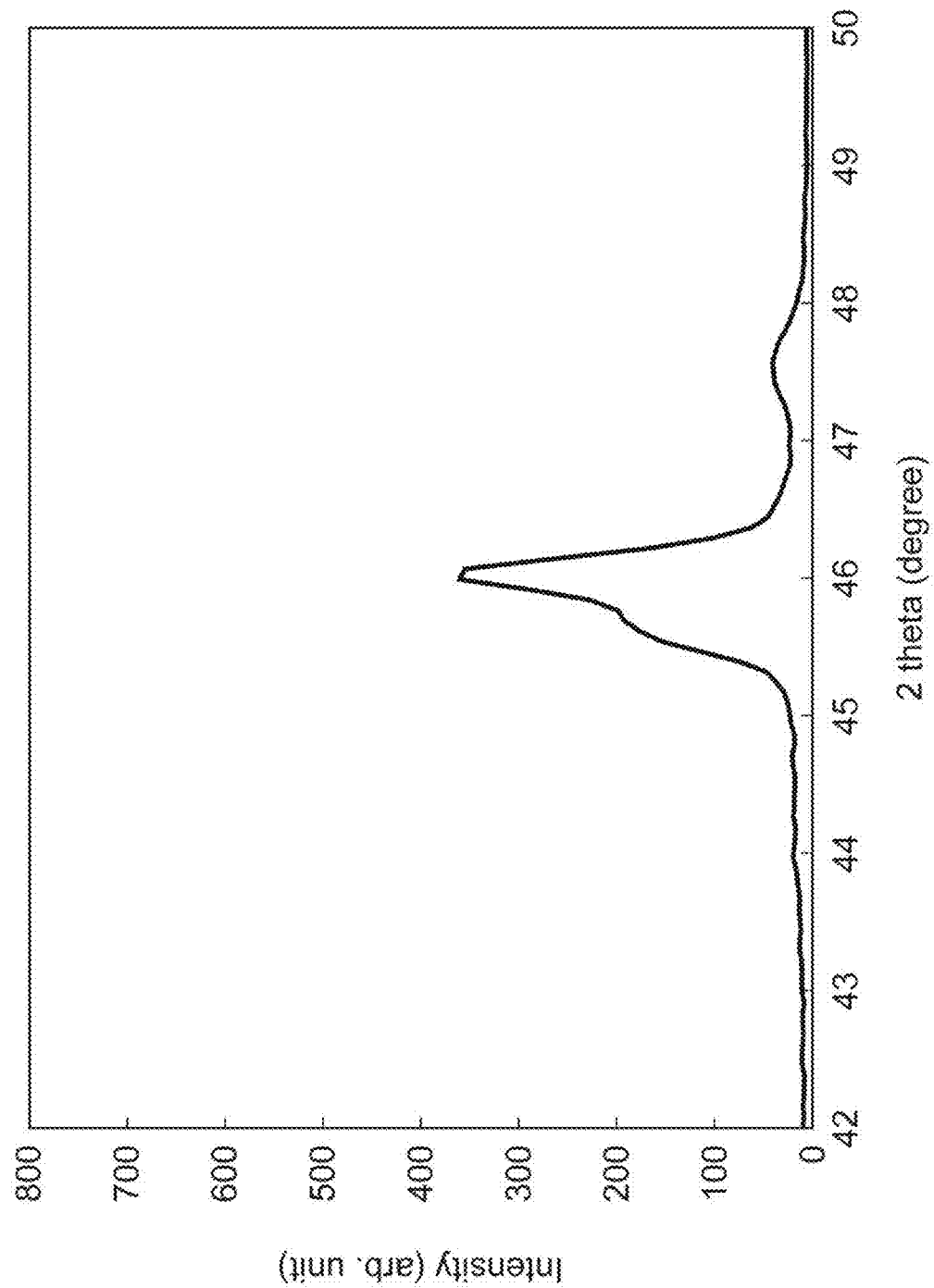
FIG. 11 is an X-ray diffraction pattern of Example 1 of the invention which is measured by Experiment 2.

In the case of Experiment 2, an X-ray diffraction (XRD) pattern of the dielectric thin film element was measured in a state in which a voltage of 20 V was applied between the first electrode layer and the second electrode layer. That is, the X-ray diffraction (XRD) pattern of the dielectric thin film element was measured in a state in which an electric field parallel to the normal direction of the surface of the dielectric thin film was applied to the dielectric thin film. The XRD pattern measured by Experiment 2 is shown in FIG. 11.

The XRD pattern had a peak continuous over a range where the diffraction angle 2θ is 45 to 47°. A diffracted X-ray with a diffraction angle 2θ of 46.0° is derived from a (100) plane of the tetragonal crystal oriented in the normal direction of the surface of the dielectric thin film. A diffracted X-ray with a diffraction angle 2θ of 45.6° is derived from a (001) plane of the tetragonal crystal oriented in the normal direction of the surface of the dielectric thin film. That is, the measured peak includes the diffracted X-ray peak derived from the (100) plane of the tetragonal crystal and the diffracted X-ray peak derived from (001) plane of the tetragonal crystal. Accordingly, in a state in which an electric field was applied to the dielectric thin film, the (100) plane of a part of the tetragonal crystal was oriented in the normal direction of the surface of the dielectric thin film, and the (001) plane of another part of the tetragonal crystal was oriented in the normal direction of the surface of the dielectric thin film. That is, the dielectric thin film of Example 1 was a multi-domain film.

The diffracted X-ray peak derived from the (100) plane of the tetragonal crystal was approximated by a Voigt function $f_{(100)}$. The diffracted X-ray peak derived from the (001) plane of the tetragonal crystal was approximated with another Voigt function $f_{(001)}$. Fitting of $f_{(100)}$ and $f_{(001)}$ to the measured peak was performed. $f_{(100)}$ after the fitting corresponds to the diffracted X-ray peak of the (100) plane which constitutes the measured peak. A peak area $A_{(100)}$ of the diffracted X-ray of the (100) plane of the tetragonal crystal was calculated from $f_{(100)}$ after the fitting. $f_{(001)}$ after the fitting corresponds to the diffracted X-ray peak of the (001) plane which constitutes the measured peak. A peak area $A_{(001)}$ of the diffracted X-ray of the (001) plane of the tetragonal crystal was calculated from $f_{(001)}$ after the fitting. Vc defined by the following Mathematical Formula A was calculated. A unit of Vc is %. Vc of Example 1 is shown in the following Table 1.

$$Vc = 100 \times A_{(001)} / (A_{(100)} + A_{(001)}) \quad (A)$$

The XRD pattern of Experiment 1 and the XRD pattern of Experiment 2 were compared with each other. From a result of the comparison, it was confirmed that the intensity of the diffracted X-ray peak derived from the (100) plane of the tetragonal crystal decreases due to application of an electric field to the dielectric thin film.

Experiments 1 and 2 show that a part of an a-domain is changed into a c-domain due to application of the electric field to the dielectric thin film. That is, a domain switching effect occurred in the dielectric thin film of Example 1.

Experiment 3

After Experiment 2, the following Experiment 3 was conducted.

Figure 12:
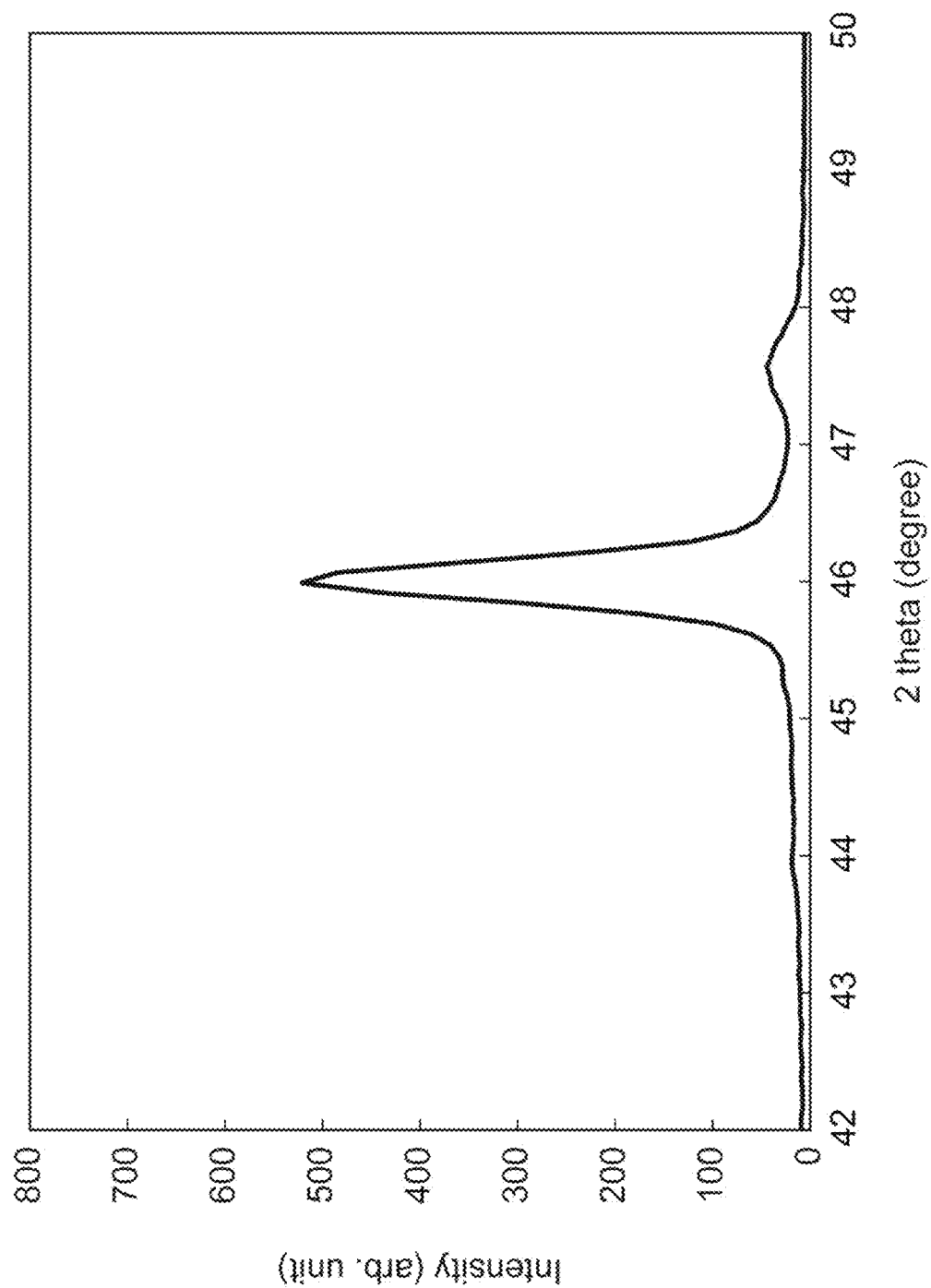
FIG. 12 is an X-ray diffraction pattern of Example 1 of the invention which is measured by Experiment 3.

In Experiment 3, the voltage applied between the first electrode layer and the second electrode layer was returned to zero. A method of Experiment 3 was the same as in Experiment 1 except that Experiment 3 was conducted after Experiment 2. An XRD pattern measured by Experiment 3 is shown in FIG. 12. A shape of the XRD pattern measured by Experiment 3 was approximately the same as the shape of the XRD pattern measured by Experiment 1. That is, due to disappearance of the electric field applied to the dielectric thin film, the peak of the diffracted X-ray of the (001) plane of the tetragonal crystal disappeared and the intensity of the peak of the diffracted X-ray of the (100) plane of the tetragonal crystal was restored. Accordingly, it was confirmed that the domain switching effect is reversible. In other words, due to disappearance of the electric field applied to the dielectric thin film, the c-domain was returned to the a-domain.

[Calculation of Relative Permittivity]

Capacitance C of the dielectric thin film element was measured. Details of the measurement of the capacitance C was as follows.

Measurement device: Impedance Gain-Phase Analyzer 4194A manufactured by Hewlett Packard Company
Frequency: 10 kHz
Electric field: 0.1 V/μm A relative permittivity $\varepsilon_r$ was calculated from a measured value of the capacitance C on the basis of the following Mathematical Formula B. $\varepsilon_r$ in Example 1 is shown in the following Table 1.

$$C = \varepsilon_0 \times \varepsilon_r \times (S/d) \quad (B)$$

$\varepsilon_0$ in Mathematical Formula B is a permittivity of vacuum $(8.854 \times 10^{-2} \text{ Fm}^{-1})$. S in Mathematical Formula B is an area of the surface of the dielectric thin film. S may be referred to as an area of the first electrode layer stacked on the dielectric thin film. d in Mathematical Formula B is a thickness of the dielectric thin film.

[Measurement of Piezoelectric Constant $d_{33}$]

A piezoelectric constant $d_{33}$ of the dielectric thin film of Example 1 was measured by using the dielectric thin film element of Example 1. A device in which an atomic force microscope (AFM) and ferroelectric material evaluation system are combined was used for the measurement. The atomic force microscope was SPA-400 manufactured by Seiko Instruments Inc., and the ferroelectric material evaluation system was FCE manufactured by TOYO Corporation. A frequency of an AC electric field (AC voltage) in the measurement of the piezoelectric constant $d_{33}$ was 5 Hz. A maximum value of a voltage applied to the dielectric thin film was 20 V. A unit of $d_{33}$ is pm/V. The piezoelectric constant $d_{33}$ of Example 1 is shown in the following Table 1.

[Measurement of Piezoelectric Constant $-e_{31,f}$]

To measure a piezoelectric constant $-e_{31,f}$ of the dielectric thin film, a rectangular sample (cantilever) was prepared as the dielectric thin film element of Example 1. Dimensions of the sample were 3 mm (width)×15 mm (length). The sample was the same as the dielectric thin film element of the above Example 1 except for the dimensions. A self-made evaluation system was used for the measurement. One end of the sample was fixed, and the other end of the sample was a free end. A displacement amount of the free end of the sample was measured with a laser while applying a voltage to the dielectric thin film in the sample. In addition, the piezoelectric constant $-e_{31,f}$ was calculated from the following Mathematical Formula C. $E_s$ in Mathematical Formula C is a Youngs modulus of the single crystal substrate. $h_s$ is a thickness of the single crystal substrate. L is a length of the sample (cantilever). $v_s$ is a Poissons ratio of the single crystal substrate. $\delta_{out}$ is an output displacement based on the measured displacement amount. $V_{in}$ is a voltage applied to the dielectric thin film. A frequency of the AC electric field (AC voltage) in the measurement of the piezoelectric constant $-e_{31,f}$ was 500 Hz. A maximum value of the voltage applied to the dielectric thin film was 20 V. A unit of $-e_{31,f}$ was C/m². The piezoelectric constant $-e_{31,f}$ of Example 1 is shown in the following Table 1.

[Mathematical Formula 1]

$$-e_{31,f} = \frac{E_s h_s^2}{3L^2(1-v_s)} \cdot \frac{\delta_{out}}{V_{in}} \quad (C)$$

Example 2

As described below, a dielectric thin film element of Example 2 is different from the dielectric thin film element of Example 1 in a composition of the second buffer layer.

In the case of Example 2, the second buffer layer (second crystalline layer) consisting of a $SrRuO_3$ crystal was formed on the entire surface of the first buffer layer in a vacuum chamber. The second buffer layer was formed by epitaxial growth using a PLD method. As a PLD target, $SrRuO_3$ was used. A temperature of the single crystal substrate in a process of forming the second buffer layer was maintained at 500° C. A surface of the second buffer layer was a (100) plane of $SrRuO_3$. A thickness of the second buffer layer was 50 nm.

The dielectric thin film element of Example 2 was prepared by the same method as in Example 1 except for the above matters. The dielectric thin film element of Example 2 included the single crystal substrate, the first adhesion layer stacked on the single crystal substrate, the second adhesion layer stacked on the first adhesion layer, the first electrode layer stacked on the second adhesion layer, the first buffer layer stacked on the first electrode layer, the second buffer layer stacked on the first buffer layer, the dielectric thin film stacked on the second buffer layer, and the second electrode layer stacked on the dielectric thin film.

The dielectric thin film element of Example 2 was analyzed by the same method as in Example 1.

It was confirmed that a composition of the dielectric thin film of Example 2 is expressed by the above Chemical Formula 1, and a value of x in the above Chemical Formula 1 is 0.3. An XRD pattern of the dielectric thin film of Example 2 implied that the BNT-BT constituting the dielectric thin film is a crystal having a perovskite structure.

The BNT-BT crystal of Example 2 was a tetragonal crystal having the perovskite structure, a crystal plane parallel to the surface of the dielectric thin film was the (100) plane of the tetragonal crystal, and a crystal plane of the tetragonal crystal perpendicular to the surface of the single crystal substrate was the (001) plane. That is, the (100) plane of the tetragonal crystal constituting the dielectric thin film of Example 2 was oriented in the normal direction of the surface of the dielectric thin film. A plane interval a of the (100) plane of the tetragonal crystal was 3.94 Å, and a plane interval c of the (001) plane of the tetragonal crystal was 3.98 Å. c/a was 1.01.

The XRD pattern of Example 2 did not vary in Experiments 1 to 3. Accordingly, the dielectric thin film of Example 2 was not a multi-domain film. That is, a domain switching effect did not occur in the dielectric thin film of Example 2. The XRD pattern of Example 2 did not have a diffracted X-ray peak with a diffraction angle 2θ of 45.6°. That is, the dielectric thin film of Example 2 did not include a tetragonal crystal in which a (001) plane is oriented in the normal direction of the surface of the dielectric thin film.

Vc, $\varepsilon_r$, $d_{33}$, and $-e_{31,f}$ of Example 2 are shown in the following Table 1.

Comparative Example 1

A single crystal substrate consisting of $SrTiO_3$ was prepared. A surface of the single crystal substrate was a (001) plane of $SrTiO_3$. The single crystal substrate was a square of 10 mm×10 mm. A thickness of the single crystal substrate was 500 μm.

A first electrode layer consisting of $SrRuO_3$ was formed on the entire surface of the single crystal substrate in a vacuum chamber. The first electrode layer was formed by the sputtering method. As a sputtering target, $SrRuO_3$ was used. A temperature of the single crystal substrate in a process of forming the first electrode layer was maintained at 500° C. A gas partial pressure ratio in the vacuum chamber in the process of forming the first electrode layer was oxygen argon=3:7. An atmospheric pressure inside the vacuum chamber in the process of forming the first electrode layer was maintained at 60 mTorr. A thickness of the first electrode layer was adjusted to 0.1 μm.

A dielectric thin film was formed on the entire surface of the first electrode layer. The dielectric thin film was formed by epitaxial growth using the PLD method in a vacuum chamber. A temperature of the single crystal substrate in a process of forming the dielectric thin film (film formation temperature) was maintained at 675° C. An oxygen partial pressure in the vacuum chamber in the process of forming the dielectric thin film was maintained at 200 mTorr. A BNT-BT target was used for the formation of the dielectric thin film. The BNT-BT target of Comparative Example 1 was the same as the BNT target of Example 1. The power of a laser irradiated to the BNT-BT target was 250 mJ. A frequency of the laser was 5 Hz. A thickness of the dielectric thin film was adjusted to 2000 nm.

A stacked body including the single crystal substrate, the first electrode layer stacked on the single crystal substrate, and the dielectric thin film stacked on the first electrode layer was prepared by the above-described method. A composition of the dielectric thin film located on a surface of the stacked body was analyzed by a fluorescent X-ray analysis method (XRF method). In the analysis, a device PW2404 manufactured by Koninklijke Philips N. V. was used. As a result of the analysis, it was confirmed that the composition of the dielectric thin film of Comparative Example 1 was expressed by the above Chemical Formula 1, and the value of x in the above Chemical Formula 1 was 0.3.

A second electrode layer that consisted of Pt and had a dot shape (circular shape) was formed on a surface of the dielectric thin film provided in the stacked body in the vacuum chamber. A radius of the second electrode layer was 200 μm. The second electrode layer was formed by the sputtering method. A temperature of the single crystal substrate in a process of forming the second electrode layer was maintained at 500° C. A thickness of the second electrode layer was adjusted to 0.1 μm.

A dielectric thin film element of Comparative Example 1 was prepared by the above method. The dielectric thin film element of Comparative Example 1 included the single crystal substrate, the first electrode layer stacked on the single crystal substrate, the dielectric thin film stacked on the first electrode layer, and the second electrode layer stacked on the dielectric thin film.

The dielectric thin film element of Comparative Example 1 was analyzed by the same method as in Example 1.

An XRD pattern of the dielectric thin film of Comparative Example 1 implied that the BNT-BT constituting the dielectric thin film was a crystal having a perovskite structure.

The BNT-BT crystal of Comparative Example 1 was a tetragonal crystal having the perovskite structure, a crystal plane parallel to the surface of the dielectric thin film was the (001) plane of the tetragonal crystal, and a crystal plane of the tetragonal crystal perpendicular to the surface of the single crystal substrate was the (100) plane. That is, the (001) plane of the tetragonal crystal constituting the dielectric thin film of Comparative Example 1 was oriented in the normal direction of the surface of the dielectric thin film. A plane interval a of the (100) plane of the tetragonal crystal was 3.91 Å, and a plane interval c of the (001) plane of the tetragonal crystal was 4.03 Å. c/a was 1.03.

The XRD pattern of Comparative Example 1 did not vary in Experiments 1 to 3. Accordingly, the dielectric thin film of Comparative Example 1 was not a multi-domain film. That is, a domain switching effect did not occur in the dielectric thin film of Comparative Example 1. The XRD pattern of Comparative Example 1 did not have a diffracted X-ray peak with a diffraction angle 2θ of 46.0°. That is, the dielectric thin film of Comparative Example 1 did not include a tetragonal crystal in which the (100) plane is oriented in the normal direction of the surface of the dielectric thin film.

Vc, $\varepsilon_r$, and $d_{33}$ of Comparative Example 1 are shown in the following Table 1.

TABLE 1

| | x | Oriented crystal plane | Vc [%] without electric field | Vc [%] under electric filed | $\varepsilon_r$ [-] | $d_{33}$ [pm/V] | $-e_{31,f}$ [C/m$^2$] |
|---|---|---|---|---|---|---|---|
| Example 1 | 0.30 | (100) | 0 | 29 | 1366 | 215 | 19.1 |
| Example 2 | 0.30 | (100) | 0 | 0 | 1573 | 190 | 15.5 |
| Comparative Example 1 | 0.30 | (001) | 100 | 100 | 681 | 77 | — |

Examples 3 to 6, and Comparative Examples 2 and 3

A composition of a BNT-BT target used in formation of the dielectric thin film of each of Examples 3 to 6, and Comparative Examples 2 and 3 was expressed by the above Chemical Formula 3. In each case of Examples 3 to 6, and Comparative Examples 2 and 3, a value of x in Chemical Formula 3 was adjusted to a value shown in the following Table 2.

A dielectric thin film element of each of Examples 3 to 6, and Comparative Example 2 and 3 was prepared by the same method as in Example 2 except for the composition of the BNT-BT target. In any case of Examples 3 to 6, and Comparative Examples 2 and 3, the dielectric thin film element included the single crystal substrate (Si), the first adhesion layer stacked on the single crystal substrate, the second adhesion layer stacked on the first adhesion layer, the first electrode layer stacked on the second adhesion layer, the first buffer layer (LaNiO$_3$) stacked on the first electrode layer, the second buffer layer (SrRuO$_3$) stacked on the first buffer layer, the dielectric thin film stacked on the second buffer layer, and the second electrode layer stacked on the dielectric thin film.

The dielectric thin film element of each of Examples 3 to 6, and Comparative Examples 2 and 3 was analyzed by the same method as in Example 1.

A composition of the dielectric thin film of each of Examples 3 to 6, and Comparative Examples 2 and 3 was expressed by the above Chemical Formula 1. In any case of Examples 3 to 6, and Comparative Examples 2 and 3, it was confirmed that a value of x in the above Chemical Formula 1 matched a value shown in the following Table 2. In any case of Examples 3 to 6, and Comparative Examples 2 and 3, an XRD pattern of the dielectric thin film implied that the BNT-BT constituting the dielectric thin film is a crystal having a perovskite structure.

In any case of Examples 3 to 6, the BNT-BT crystal was a tetragonal crystal having the perovskite structure, a crystal plane parallel to the surface of the dielectric thin film was a (100) plane of the tetragonal crystal, and a crystal plane of the tetragonal crystal perpendicular to the surface of the single crystal substrate was a (001) plane. That is, in any case of Examples 3 to 6, the (100) plane of the tetragonal crystal constituting the dielectric thin film was oriented in the normal direction of the surface of the dielectric thin film.

In any case of Comparative Examples 2 and 3, the BNT-BT crystal was a tetragonal crystal having the perovskite structure, a crystal plane parallel to the surface of the dielectric thin film was a (001) plane of the tetragonal crystal, and a crystal plane of the tetragonal crystal perpendicular to the surface of the single crystal substrate was a (100) plane. That is, in any case of Comparative Examples 2 and 3, the (001) plane of the tetragonal crystal constituting the dielectric thin film was oriented in the normal direction of the surface of the dielectric thin film.

$\varepsilon_r$, $d_{33}$, and $-e_{31,f}$ of each of Examples 3 to 6, and Comparative Examples 2 and 3 are shown in the following Table 2.

TABLE 2

|  | x | Oriented crystal plane | $\varepsilon_r$ [-] | $d_{33}$ [pm/V] | $-e_{31,f}$ [C/m$^2$] |
| --- | --- | --- | --- | --- | --- |
| Comparative Example 2 | 0.10 | (001) | 676 | 61 | — |
| Example 3 | 0.15 | (100) | 1816 | 146 | 7.6 |
| Example 2 | 0.30 | (100) | 1573 | 190 | 15.5 |
| Example 4 | 0.40 | (100) | 1445 | 169 | 8.9 |
| Example 5 | 0.50 | (100) | 1346 | 75 | — |
| Example 6 | 0.70 | (100) | 1159 | 56 | — |
| Comparative Example 3 | 0.80 | (001) | 589 | 53 | — |

Examples 7 to 10, and Comparative Examples 4 and 5

A composition of a BNT-BT target used in formation of a dielectric thin film of each of Examples 7 to 10 and Comparative Examples 4 and 5 was expressed by the above Chemical Formula 3. In each case of Examples 7 to 10, and Comparative Examples 4 and 5, a value of x in Chemical Formula 3 was adjusted to a value shown in the following Table 3.

The dielectric thin film element of each of Examples 7 to 10, and Comparative Examples 4 and 5 was prepared by the same method as in Example 1 except for the composition of the BNT-BT target. In any case of Examples 7 to 10, and Comparative Examples 4 and 5, the dielectric thin film element included with the single crystal substrate (Si), the first adhesion layer stacked on the single crystal substrate, the second adhesion layer stacked on the first adhesion layer, the first electrode layer stacked on the second adhesion layer, the first buffer layer (LaNiO$_3$) stacked on the first electrode layer, the second buffer layer (La$_{0.5}$Sr$_{0.5}$CoO$_3$) stacked on the first buffer layer, the dielectric thin film stacked on the second buffer layer, and the second electrode layer stacked on the dielectric thin film.

The dielectric thin film element of each of Examples 7 to 10, and Comparative Examples 4 and 5 was analyzed by the same method as in Example 1.

A composition of the dielectric thin film of each of Examples 7 to 10, and Comparative Examples 4 and 5 was expressed by the above Chemical Formula 1. In any case of Examples 7 to 10, and Comparative Examples 4 and 5, it was confirmed that a value of x in the above Chemical Formula 1 matched a value shown in the following Table 3. In any case of Examples 7 to 10, and Comparative Examples 4 and 5, an XRD pattern of the dielectric thin film implied that the BNT-BT constituting the dielectric thin film is a crystal having a perovskite structure.

In any case of Examples 7 to 10, the BNT-BT crystal was a tetragonal crystal having the perovskite structure, a crystal plane parallel to the surface of the dielectric thin film was a (100) plane of the tetragonal crystal, and a crystal plane of the tetragonal crystal perpendicular to the surface of the single crystal substrate was a (001) plane. That is, in any case of Examples 5 and 6, the (100) plane of the tetragonal crystal constituting the dielectric thin film was oriented in the normal direction of the surface of the dielectric thin film.

In any case of Comparative Examples 4 and 5, the BNT-BT crystal was a tetragonal crystal having the perovskite structure, a crystal plane parallel to the surface of the dielectric thin film was a (001) plane of the tetragonal crystal, and a crystal plane of the tetragonal crystal perpendicular to the surface of the single crystal substrate was a (100) plane. That is, in any case of Comparative Examples 4 and 5, the (001) plane of the tetragonal crystal constituting the dielectric thin film was oriented in the normal direction of the surface of the dielectric thin film.

$\varepsilon_r$, $d_{33}$, and $-e_{31,f}$ of each of Examples 7 to 10, and Comparative Examples 4 and 5 are shown in the following Table 3.

TABLE 3

|  | x | Oriented crystal plane | $\varepsilon_r$ [-] | $d_{33}$ [pm/V] | $-e_{31,f}$ [C/m$^2$] |
| --- | --- | --- | --- | --- | --- |
| Comparative Example 4 | 0.10 | (001) | 667 | 78 | — |
| Example 7 | 0.15 | (100) | 1567 | 157 | 9.8 |
| Example 1 | 0.30 | (100) | 1366 | 215 | 19.1 |
| Example 8 | 0.40 | (100) | 1213 | 188 | 11.2 |
| Example 9 | 0.50 | (100) | 1179 | 83 | — |
| Example 10 | 0.70 | (100) | 1028 | 59 | — |
| Comparative Example 5 | 0.80 | (001) | 515 | 46 | — |

INDUSTRIAL APPLICABILITY

For example, the dielectric thin film according to the invention is applied to a thin film capacitor, a piezoelectric actuator, a piezoelectric sensor, a head assembly, a head stack assembly, a hard disk drive, a printer head, and an inkjet printer device.

REFERENCE SIGNS LIST

10: dielectric thin film element, 100: piezoelectric element, 1: single crystal substrate, 2: first electrode layer, 3: dielectric thin film, 4: second electrode layer, 5a: first adhesion layer (intermediate layer), 5b: second adhesion layer (intermediate layer), 6a: first crystalline layer (intermediate layer), 6b: second crystalline layer (intermediate layer), $D_N$: normal direction of surface of single crystal substrate, dn: normal direction of surface of dielectric thin film, tc1: first unit cell of tetragonal crystal having perovskite structure, tc2: second unit cell of tetragonal crystal having perovskite structure, a: plane interval of (100) plane of tetragonal crystal, c: plane interval of (001) plane of tetragonal crystal, 200: head assembly, 9: base plate, 11: load beam, 11b: base end portion, 11c: first leaf spring portion, 11d: second leaf spring portion, 11e: opening portion, 11f: beam main portion, 15: flexible substrate, 17: flexure, 19: head slider, 19a: head element, 300: piezoelectric actuator, 20: base body, 21: pressure chamber, 23: insulating film, 24: single crystal substrate, 25: piezoelectric thin film, 26: upper electrode layer (first electrode layer), 27: nozzle, 400: Gyro sensor, 110: base portion, 120, 130: arm, 30: piezoelectric thin film, 31: upper electrode layer (first electrode layer), 31a, 31b: drive electrode layer, 31c, 31d: detection electrode layer, 32: single crystal substrate, 500: pressure sensor, 40: piezoelectric element, 41: common electrode layer, 42: piezoelectric thin film, 43: individual electrode layer, 44: support body, 45: cavity, 46: current amplifier, 47: voltage measurement device, 600: pulse wave sensor, 50: piezoelectric element, 51: common electrode layer, 52: piezoelectric thin film, 53: individual electrode layer, 54: support body, 55: voltage measurement device, 700: hard disk drive, 60: casing, 61: hard disk, 62: head stack assembly, 63: voice coil motor, 64: actuator arm, 65: head assembly, 800: inkjet printer device, 70: printer head, 71: main body, 72: tray, 73: head drive mechanism, 74: ejection port, 75: recording paper, 76: auto sheet feeder (automatic continuous paper feeding mechanism).

The invention claimed is:

1. A dielectric thin film, including:
a metal oxide,
wherein the metal oxide includes bismuth, sodium, barium, and titanium,
at least a part of the metal oxide is a tetragonal crystal having a perovskite structure,
a (100) plane of the entirety of the tetragonal crystal is oriented in a normal direction of a surface of the dielectric thin film, and
the metal oxide is expressed by Chemical Formula 1 as follows:

$$(1-x)(Bi_{0.5}Na_{0.5})TiO_3\text{-}xBaTiO_3 \quad (1),$$

where x satisfies $0.30 \leq x \leq 0.40$.

2. The dielectric thin film according to claim 1,
wherein when an electric field parallel to the normal direction of the surface of the dielectric thin film is applied to the dielectric thin film, a peak area of a diffracted X-ray of a (001) plane of the tetragonal crystal does not increase.

3. The dielectric thin film according to claim 1,
wherein when an electric field parallel to the normal direction of the surface of the dielectric thin film is applied to the dielectric thin film, a peak area of a diffracted X-ray of a (001) plane of the tetragonal crystal increases.

4. The dielectric thin film according to claim 1,
wherein in a state in which an electric field parallel to the normal direction of the surface of the dielectric thin film is applied to the dielectric thin film,
a (100) plane of a part of the tetragonal crystal is oriented in the normal direction of the surface of the dielectric thin film, and
a (001) plane of another part of the tetragonal crystal is oriented in the normal direction of the surface of the dielectric thin film.

5. The dielectric thin film according to claim 1,
wherein [100] is a crystal orientation of the tetragonal crystal, and
the [100] of the tetragonal crystal is parallel to the normal direction of the surface of the dielectric thin film.

6. The dielectric thin film according to claim 1,
wherein the normal direction of the surface of the dielectric thin film corresponds to a thickness direction of the dielectric thin film.

7. A dielectric thin film element, comprising:
the dielectric thin film according to claim 1.

8. The dielectric thin film element according to claim 7, comprising:
a single crystal substrate; and
the dielectric thin film stacked on the single crystal substrate,
wherein a (100) plane of at least a part of the tetragonal crystal is oriented in a normal direction of a surface of the single crystal substrate.

9. The dielectric thin film element according to claim 8, comprising:
the single crystal substrate;
a first electrode layer stacked on the single crystal substrate;
the dielectric thin film stacked on the single crystal substrate through the first electrode layer; and
a second electrode layer stacked on the dielectric thin film.

10. The dielectric thin film element according to claim 9, further comprising:
at least one intermediate layer,
wherein the intermediate layer is disposed between the single crystal substrate and the first electrode layer, between the first electrode layer and the dielectric thin film, or between the dielectric thin film and the second electrode layer.

11. The dielectric thin film element according to claim 8, comprising:
the single crystal substrate;
a first electrode layer stacked on the single crystal substrate;
a first crystalline layer stacked on the first electrode layer;
a second crystalline layer stacked on the first crystalline layer;
the dielectric thin film stacked on the second crystalline layer; and
a second electrode layer stacked on the dielectric thin film,
wherein the first crystalline layer includes a $LaNiO_3$ crystal having a perovskite structure,
the second crystalline layer includes a $SrRuO_3$ crystal having the perovskite structure,
a (100) plane of the first crystalline layer is oriented in a normal direction of a surface of the single crystal substrate, and
a (100) plane of the second crystalline layer is oriented in the normal direction of the surface of the single crystal substrate.

12. The dielectric thin film element according to claim 8, comprising:
the single crystal substrate;
a first electrode layer stacked on the single crystal substrate;
a first crystalline layer stacked on the first electrode layer;
a second crystalline layer stacked on the first crystalline layer;
the dielectric thin film stacked on the second crystalline layer; and
a second electrode layer stacked on the dielectric thin film,
wherein the first crystalline layer includes a $LaNiO_3$ crystal having a perovskite structure,
the second crystalline layer includes a $(La, Sr)CoO_3$ crystal having a perovskite structure,
a (100) plane of the first crystalline layer is oriented in a normal direction of a surface of the single crystal substrate, and
a (100) plane of the second crystalline layer is oriented in the normal direction of the surface of the single crystal substrate.

13. The dielectric thin film element according to claim 7,
wherein the dielectric thin film element is a piezoelectric element.

14. A piezoelectric sensor, comprising:
the dielectric thin film element according to claim 13.

15. A piezoelectric actuator, comprising:
the dielectric thin film element according to claim 13.

16. A head assembly, comprising:
the piezoelectric actuator according to claim 15.

17. A head stack assembly, comprising:
the head assembly according to claim 16.

18. A hard disk drive, comprising:
the head stack assembly according to claim 17.

19. A printer head, comprising:
the piezoelectric actuator according to claim 15.

20. An inkjet printer device, comprising:
the printer head according to claim 19.

* * * * *